United States Patent
Carothers et al.

(10) Patent No.: US 11,417,725 B2
(45) Date of Patent: *Aug. 16, 2022

(54) ISOLATION OF CIRCUIT ELEMENTS USING FRONT SIDE DEEP TRENCH ETCH

(71) Applicant: Texas Instruments Incorporated, Dallas, TX (US)

(72) Inventors: Dan Carothers, Lucas, TX (US); Ricky Jackson, Richardson, TX (US); Rajarshi Mukhopadhyay, Allen, TX (US); Ben Cook, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/104,478

(22) Filed: Nov. 25, 2020

(65) Prior Publication Data
US 2021/0083047 A1 Mar. 18, 2021

Related U.S. Application Data

(62) Division of application No. 16/266,677, filed on Feb. 4, 2019, now Pat. No. 10,854,712, which is a division
(Continued)

(51) Int. Cl.
*H01L 29/06* (2006.01)
*H01L 23/522* (2006.01)
(Continued)

(52) U.S. Cl.
CPC ........ *H01L 29/0649* (2013.01); *H01L 21/762* (2013.01); *H01L 21/76224* (2013.01);
(Continued)

(58) Field of Classification Search
CPC .............. H01L 29/0649; H01L 21/762; H01L 21/76224; H01L 23/5223; H01L 23/5226;
(Continued)

(56) References Cited

U.S. PATENT DOCUMENTS 4,470,062 A * 9/1984 Muramatsu ........... H01L 21/765
257/659
4,808,548 A * 2/1989 Thomas .............. H01L 27/0623
257/370
(Continued)

FOREIGN PATENT DOCUMENTS

CN 101681890 A 3/2010

OTHER PUBLICATIONS

Office Action for Chinese Patent Application No. 201610922826.6, dated Apr. 23, 2021, 9 pages.
CN101681890A, English Machine Translation, 27 pages.

*Primary Examiner* — Mohammed Shamsuzzaman
(74) *Attorney, Agent, or Firm* — Michael A. Davis, Jr.; Charles A. Brill; Frank D. Cimino

(57) ABSTRACT

An integrated circuit is formed by forming an isolation trench through at least a portion of an interconnect region, at least 40 microns deep into a substrate of the integrated circuit, leaving at least 200 microns of substrate material under the isolation trench. Dielectric material is formed in the isolation trench at a substrate temperature no greater than 320° C. to form an isolation structure which separates an isolated region of the integrated circuit from at least a portion of the substrate. The isolated region contains an isolated component. The isolated region of the integrated circuit may be a region of the substrate, and/or a region of the interconnect region. The isolated region may be a first portion of the substrate which is laterally separated from a second portion of the substrate. The isolated region may be a portion of the interconnect region above the isolation structure.

3 Claims, 37 Drawing Sheets

Related U.S. Application Data of application No. 14/924,584, filed on Oct. 27, 2015, now Pat. No. 10,199,461.

(51) Int. Cl.

| | | |
|---|---|---|
| *H01L 21/762* | (2006.01) | |
| *H01L 49/02* | (2006.01) | |
| *H01L 29/417* | (2006.01) | |
| *H01L 21/8234* | (2006.01) | |

(52) U.S. Cl.
CPC ...... *H01L 23/5223* (2013.01); *H01L 23/5226* (2013.01); *H01L 28/00* (2013.01); *H01L 28/40* (2013.01); *H01L 21/823481* (2013.01); *H01L 29/4175* (2013.01); *H01L 2224/4813* (2013.01); *H01L 2224/48091* (2013.01); *H01L 2224/48464* (2013.01)

(58) Field of Classification Search
CPC . H01L 28/00; H01L 28/40; H01L 21/823481; H01L 29/4175; H01L 2224/48091; H01L 2224/4813; H01L 2224/48464; H01L 27/02

See application file for complete search history.

(56) References Cited

U.S. PATENT DOCUMENTS

| | | | | |
|---|---|---|---|---|
| 4,871,685 A * | 10/1989 | Taka | ................ | H01L 21/763 257/E21.375 |
| 5,206,182 A * | 4/1993 | Freeman | ................ | H01L 21/764 438/210 |
| 5,371,047 A * | 12/1994 | Greco | ................ | H01L 21/76829 438/763 |
| 5,757,081 A * | 5/1998 | Chang | ................ | H01L 23/3738 257/713 |
| 5,952,680 A * | 9/1999 | Strite | ................ | H01L 33/325 257/89 |
| 5,985,693 A * | 11/1999 | Leedy | ................ | G03F 7/70658 257/E25.011 |
| 6,078,057 A * | 6/2000 | Vallett | ................ | H01L 22/32 257/621 |
| 6,091,129 A * | 7/2000 | Cleeves | ................ | H01L 21/76804 257/E21.507 |
| 6,239,354 B1 * | 5/2001 | Wanlass | ................ | H01L 31/0735 257/466 |
| 6,258,697 B1 * | 7/2001 | Bhakta | ................ | H01L 21/31612 257/E21.546 |
| 6,261,945 B1 * | 7/2001 | Nye, III | ................ | H01L 23/564 257/E21.582 |
| 6,642,566 B1 * | 11/2003 | Mandelman | ................ | H01L 27/10891 257/302 |
| 7,544,602 B2 * | 6/2009 | Clevenger | ................ | H01L 21/76808 438/619 |
| 7,723,800 B2 * | 5/2010 | Moens | ................ | H01L 21/76224 257/397 |
| 7,790,602 B1 * | 9/2010 | Yegnashankaran | ................ | H01L 23/5222 438/700 |
| 7,923,790 B1 * | 4/2011 | Quevy | ................ | B81C 1/00293 257/415 |
| 8,604,618 B2 * | 12/2013 | Cooney, III | ................ | H01L 21/76802 257/784 |
| 8,933,473 B1 * | 1/2015 | Dubin | ................ | H01L 21/67703 257/79 |
| 8,937,009 B2 * | 1/2015 | Daubenspeck | ................ | H01L 24/11 438/18 |
| 8,969,967 B2 * | 3/2015 | Noel | ................ | H01L 21/823878 257/351 |
| 9,184,041 B2 * | 11/2015 | Chen | ................ | H01L 27/10829 |
| 9,245,790 B2 * | 1/2016 | Thangaraju | ................ | H01L 23/528 |
| 9,419,075 B1 | 8/2016 | Carothers et al. | | |
| 9,673,154 B2 * | 6/2017 | Tsutsue | ................ | H01L 23/562 |
| 9,831,272 B2 * | 11/2017 | Chen | ................ | H01L 27/0207 |
| 2002/0113288 A1 * | 8/2002 | Clevenger | ................ | H01L 23/3732 257/E23.105 |
| 2002/0158322 A1 * | 10/2002 | Farrar | ................ | H01L 21/76224 257/E21.546 |
| 2003/0211701 A1 * | 11/2003 | Desko | ................ | H01L 21/76237 438/424 |
| 2004/0106299 A1 * | 6/2004 | Walker | ................ | H01L 21/76895 257/E21.538 |
| 2005/0247966 A1 * | 11/2005 | Adkisson | ................ | H01L 27/10841 257/E21.652 |
| 2006/0216894 A1 * | 9/2006 | Parekh | ................ | H01L 27/10876 257/E21.655 |
| 2006/0264035 A1 * | 11/2006 | Nogami | ................ | H01L 21/76829 438/643 |
| 2007/0037394 A1 * | 2/2007 | Su | ................ | H01L 21/76838 257/E21.582 |
| 2007/0045732 A1 * | 3/2007 | Lin | ................ | H01L 21/743 257/E21.538 |
| 2008/0081404 A1 * | 4/2008 | Barna | ................ | H01L 21/76232 257/E21.549 |
| 2008/0277765 A1 * | 11/2008 | Lane | ................ | H01L 23/5329 257/E21.546 |
| 2009/0079027 A1 * | 3/2009 | Cheng | ................ | H01L 21/84 438/430 |
| 2009/0160050 A1 * | 6/2009 | Miyakawa | ................ | H01L 25/117 257/737 |
| 2009/0184357 A1 * | 7/2009 | Wu | ................ | H01L 21/26586 257/E27.092 |
| 2009/0325104 A1 * | 12/2009 | Hayashi | ................ | H01L 21/31144 430/312 |
| 2010/0156526 A1 * | 6/2010 | Botula | ................ | H01L 21/84 257/E21.546 |
| 2010/0190334 A1 * | 7/2010 | Lee | ................ | H01L 24/94 257/E21.583 |
| 2010/0200960 A1 * | 8/2010 | Angyal | ................ | H01L 23/585 257/E23.179 |
| 2010/0201440 A1 * | 8/2010 | Nowak | ................ | H01L 27/1203 716/30 |
| 2010/0301491 A1 * | 12/2010 | Yang | ................ | H01L 21/02063 438/653 |
| 2011/0049600 A1 * | 3/2011 | Aoki | ................ | H01L 27/10897 438/386 |
| 2011/0068398 A1 * | 3/2011 | Anderson | ................ | H01L 29/4916 438/151 |
| 2011/0193240 A1 * | 8/2011 | Farooq | ................ | H01L 25/0657 228/199 |
| 2011/0241185 A1 * | 10/2011 | Koester | ................ | H01L 25/0657 257/E21.597 |
| 2012/0009720 A1 * | 1/2012 | Shim | ................ | H01L 27/14625 257/E31.127 |
| 2012/0025199 A1 * | 2/2012 | Chen | ................ | H01L 27/1464 438/96 |
| 2012/0288083 A1 * | 11/2012 | Sun | ................ | H01L 21/743 257/774 |
| 2012/0326309 A1 | 12/2012 | Andry et al. | | |
| 2013/0001793 A1 * | 1/2013 | Yu | ................ | H01L 21/76898 257/774 |
| 2013/0093098 A1 * | 4/2013 | Yang | ................ | H01L 21/76898 438/653 |
| 2013/0113061 A1 * | 5/2013 | Lai | ................ | H01L 31/09 257/E31.127 |
| 2013/0221494 A1 * | 8/2013 | Ramachandran | ..... | H01L 23/481 257/E21.597 |
| 2013/0320519 A1 * | 12/2013 | Kim | ................ | H01L 23/3114 257/734 |
| 2013/0320554 A1 * | 12/2013 | Barth | ................ | H01L 21/76828 257/E21.586 |
| 2014/0124845 A1 | 5/2014 | Cheng et al. | | |
| 2014/0246757 A1 * | 9/2014 | Daley | ................ | G06F 30/394 257/621 |
| 2014/0264767 A1 * | 9/2014 | Gratz | ................ | H01L 23/585 257/620 |
| 2014/0291767 A1 * | 10/2014 | Lee | ................ | H01L 29/66659 438/422 |

(56) References Cited

U.S. PATENT DOCUMENTS

| | | | |
|---|---|---|---|
| 2015/0048452 A1* | 2/2015 | Chen | H01L 29/7823 |
| | | | 438/286 |
| 2015/0123240 A1* | 5/2015 | Bowman | H01L 29/732 |
| | | | 438/437 |
| 2015/0348874 A1* | 12/2015 | Tsai | H01L 21/76898 |
| | | | 257/774 |
| 2015/0348917 A1* | 12/2015 | Tsai | H01L 23/585 |
| | | | 438/618 |
| 2015/0349023 A1* | 12/2015 | Debord | H01L 27/0617 |
| | | | 438/54 |
| 2015/0371893 A1* | 12/2015 | Chou | H01L 21/84 |
| | | | 257/621 |
| 2016/0056234 A1* | 2/2016 | Cheng | H01L 21/823481 |
| | | | 327/535 |
| 2016/0111381 A1* | 4/2016 | Werner | H01L 21/02118 |
| | | | 438/618 |
| 2016/0172311 A1* | 6/2016 | Pagani | H01L 21/76224 |
| | | | 324/762.01 |
| 2016/0336183 A1* | 11/2016 | Yuan | H01L 27/0886 |
| 2016/0351604 A1* | 12/2016 | Kalnitsky | H01L 27/14636 |
| 2017/0133414 A1* | 5/2017 | Chiang | H01L 27/14689 |
| 2017/0256638 A1* | 9/2017 | Macelwee | H01L 21/3043 |
| 2017/0287933 A1* | 10/2017 | Chen | H01L 27/0207 |
| 2018/0122752 A1* | 5/2018 | Pagani | G01R 31/2872 |
| 2019/0057959 A1* | 2/2019 | Or-Bach | H01L 27/14634 |
| 2019/0097075 A1* | 3/2019 | Rae | H01L 27/1443 |
| 2019/0103339 A1* | 4/2019 | Goktepeli | H01L 21/823481 |
| 2019/0293692 A1* | 9/2019 | Clarke | H02H 9/042 |
| 2020/0381420 A1* | 12/2020 | Chen | H01L 28/90 |

* cited by examiner

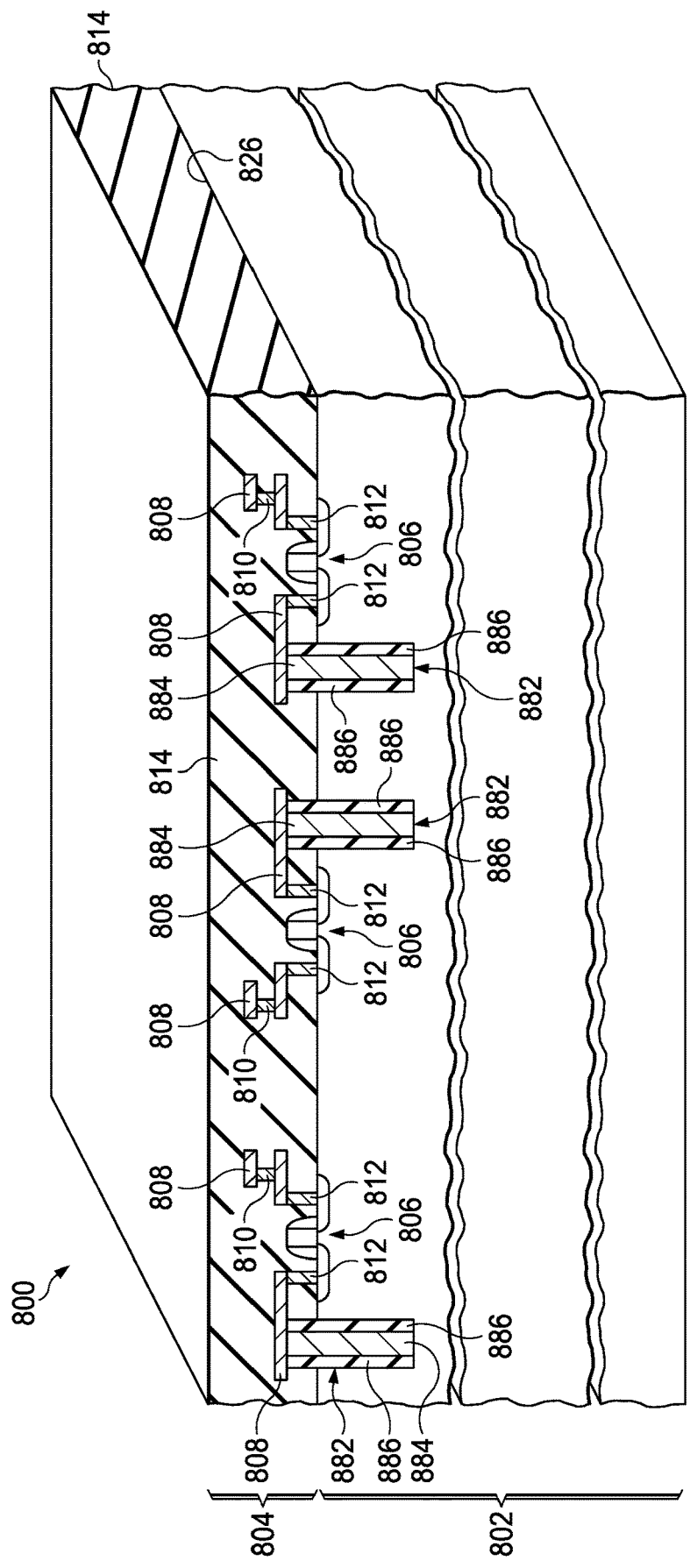

ISOLATION OF CIRCUIT ELEMENTS USING FRONT SIDE DEEP TRENCH ETCH

CROSS-REFERENCE TO RELATED APPLICATIONS

This application is a divisional of U.S. patent application Ser. No. 16/266,677 filed Feb. 4, 2019, which is a divisional of U.S. patent application Ser. No. 14/924,584 filed Oct. 27, 2015 (issued as U.S. Pat. No. 10,199,461), the entireties of all of which are incorporated herein by reference.

BACKGROUND

This relates generally to integrated circuits, and more particularly to isolation structures in integrated circuits.

Some electronic circuits include components with large differences in operating potentials, and the semiconductor substrates of the components must be electrically isolated. Putting the isolated components in separate chips undesirably increases chip count and cost of the circuits. Putting the isolated components in the same chips with common semiconductor substrates requires isolating portions of the substrates, which has been problematic and costly.

SUMMARY

An integrated circuit may be formed by forming an isolation trench from a top side of the integrated circuit, through at least a portion of an interconnect region, the portion containing interconnects, and at least 40 microns deep into a substrate of the integrated circuit. At least 200 microns of substrate material remains in the substrate under the isolation trench when the isolation trench is formed. Dielectric material is formed in the isolation trench while the substrate is at a temperature no greater than 320° C. to form an isolation structure which separates an isolated region of the integrated circuit from at least a portion of the substrate. The isolated region of the integrated circuit may be a region of the substrate, and/or a region of the interconnect region. The isolated region contains an isolated component of the integrated circuit.

The isolation structure may extend into a singulation zone surrounding the integrated circuit, so that the isolated region is a first portion of the substrate which is laterally separated from a second portion of the substrate. The isolation structure may have a closed-loop configuration surrounding a first portion of the substrate which is the isolated region, and so laterally separating the isolated region from a remainder of the substrate. The isolated region may be a portion of the interconnect region above the isolation structure, and the isolated component may be formed in the isolated region, so that the isolated component is separated from the substrate.

BRIEF DESCRIPTION OF THE DRAWINGS

FIG. 8A through FIG. 8G are cross sections of another example integrated circuit with an isolation structure, depicted in successive stages of an example method of formation.

DETAILED DESCRIPTION OF EXAMPLE EMBODIMENTS

Figure 1:
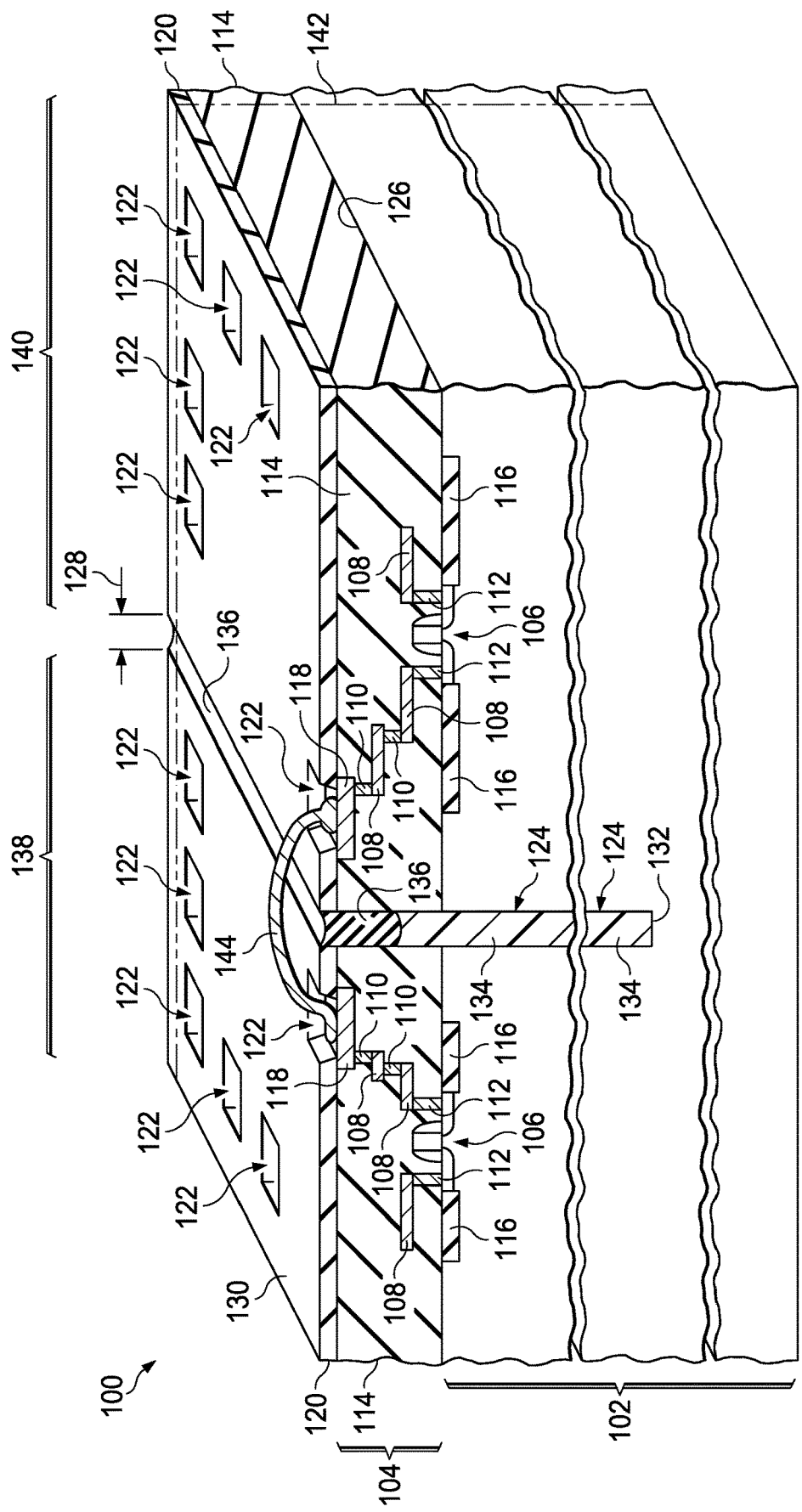
FIG. 1 is a cross section of an example integrated circuit with an isolation structure.

The drawings are not necessarily drawn to scale. Example embodiments are not limited by the illustrated ordering of acts or events, as some acts or events may occur in different orders and/or concurrently with other acts or events. Furthermore, some illustrated acts or events are optional to implement a methodology in accordance with example embodiments.

An integrated circuit may be formed by forming an isolation trench from a top side of the integrated circuit, through at least a portion of an interconnect region, and at least 40 microns deep into a substrate of the integrated circuit. At least 200 microns of substrate material remains in the substrate under the isolation trench when the isolation trench is formed. Dielectric material is formed in the isolation trench while the substrate is at a temperature no greater than 320° C. to form an isolation structure which separates an isolated region of the integrated circuit from at least a portion of the substrate. The isolated region of the integrated circuit may be a region of the substrate, and/or a region of the interconnect region. The isolated region contains an isolated component of the integrated circuit. A top surface of the isolation structure is higher than at least some interconnects in the interconnect region. Forming the dielectric material at a substrate temperature no greater than 320° C. may advantageously reduce degradation of the interconnects and of components of the integrated circuit.

The isolation structure may extend into a singulation zone surrounding the integrated circuit, so that the isolated region is a first portion of the substrate which is laterally separated from a second portion of the substrate. The isolation structure may have a closed-loop configuration surrounding a first portion of the substrate which is the isolated region, and so laterally separating the isolated region from a remainder of the substrate. Forming the isolation structure with the depth of at least 40 microns in the substrate places the bottom of the isolation structure below any horizontal isolation layers, such as buried layers, so that a combination of the isolation structure and a horizontal isolation layer may electrically isolate the isolated region from the remainder of the substrate. The isolated region may be a portion of the interconnect region above the isolation structure, and the isolated component may be formed in the isolated region, so that the isolated component is separated from the substrate.

Additional processing at the bottom surface of the substrate may provide further isolation. For example, the substrate may be thinned globally across the area of the integrated circuit from the bottom surface, so that substrate material below the bottom of the isolation structure is removed up to the bottom of the isolation trench. Thinning the substrate globally may also provide a desired thickness for thermal management. In another example, substrate material may be removed from the bottom surface locally under the isolation structure, so that the substrate proximate to the isolation trench retains its full thickness, which may provide a desired mechanical strength. A combination of global and local material removal from the bottom surface of the substrate may provide a desired balance between thermal management and mechanical strength.

FIG. 1 is a cross section of an example integrated circuit with an isolation structure. The integrated circuit 100 includes a substrate 102 which includes semiconductor material such as crystalline silicon, gallium arsenide or crystalline silicon with layers of III-N semiconductor material such as gallium nitride and gallium aluminum nitride. The integrated circuit 100 includes an interconnect region 104 over the substrate 102. The integrated circuit 100 includes components 106, depicted in FIG. 1 as metal oxide semiconductor (MOS) transistors 106. The interconnect region 104 includes interconnects 108, and possibly vias 110 between levels of the interconnects 108, and possibly contacts 112 connecting the interconnects 108 to the components 106. The interconnects 108, vias 110 and contacts 112 are disposed in interconnect dielectric layers 114 of the interconnect region 104. The interconnect dielectric layers 114 may be arranged in layers of silicon dioxide-based material such as boron phosphorus silicate glass (BPSG), phosphorus silicate glass (PSG), and/or silicon dioxide, with etch stop layers, cap layers and/or barrier layers of dielectric material such as silicon nitride, silicon carbide, and/or silicon carbide nitride. Field oxide 116 may be disposed in the substrate 102 to laterally isolate the components 106. In the instant example, the integrated circuit 100 may include bond pads 118 and a protective overcoat 120 over the interconnect region 104 with openings 122 for the bond pads 118. The protective overcoat 120 may include polymer layers and/or inorganic dielectric layers. The protective overcoat 120 is sometimes referred to as the top glass or the scratch coat.

The integrated circuit 100 includes the isolation structure 124, which extends through at least a portion of the interconnect region 104 and at least 40 microns deep into the substrate 102 below a top surface 126 of the substrate 102 at a boundary between substrate 102 and the interconnect region 104. In the instant example, the isolation structure 124 may extend through the protective overcoat 120 and through the complete interconnect region 104, as depicted in FIG. 1. The isolation structure 124 may have a width 128 of, for example, 5 microns to 25 microns. The isolation structure 124 includes isolation dielectric material contacting the substrate 102 and the interconnect region 104, extending from proximate to a top 130 of the isolation structure 124 to a bottom 132 of the isolation structure 124. In the instant example, the isolation dielectric material may include a first dielectric material 134 disposed in a lower portion of the isolation structure 124 and extending to the bottom 132 of the isolation structure 124, and a second dielectric material 136 disposed in an upper portion of the isolation structure 124 over the lower portion, and extending proximate to the top 130 of the isolation structure 124. In the instant example, the isolation structure 124 may laterally separate an isolated region 138 which is a first portion of the substrate 102 from a second portion 140 of the substrate 102. At least one of the components 106 is disposed in the isolated region 138. In the instant example, the isolation structure 124 may extend into a singulation zone 142 of the integrated circuit 100. The singulation zone 142 may be, for example a scribe street or saw lane, for singulating the integrated circuit 100 from a wafer containing multiple integrated circuits.

One or more of the components 106 in the isolated region 138 of the substrate 102 may be electrically coupled to one or more of the components 106 in the second portion 140 of the substrate 102. In the instant example, one of the components 106 in the isolated region 138 may be connected to one of the bond pads 118 by the interconnects 108, vias 110 and contacts 112, and one of the components 106 in the second portion 140 may be connected to one of the bond pads 118 by the interconnects 108, vias 110 and contacts 112. The bond pads are electrically connected by a wire bond 144. Other configurations for electrically coupling the components 106 in the isolated region 138 with the components 106 in the second portion 140 are within the scope of the instant example. The isolation structure 124 may advantageously provide a reduced cost for an application using the integrated circuit 100 compared to a similar application using two separate integrated circuits for the isolated region 138 and the second portion 140 of the substrate 102.

Figure 2A:
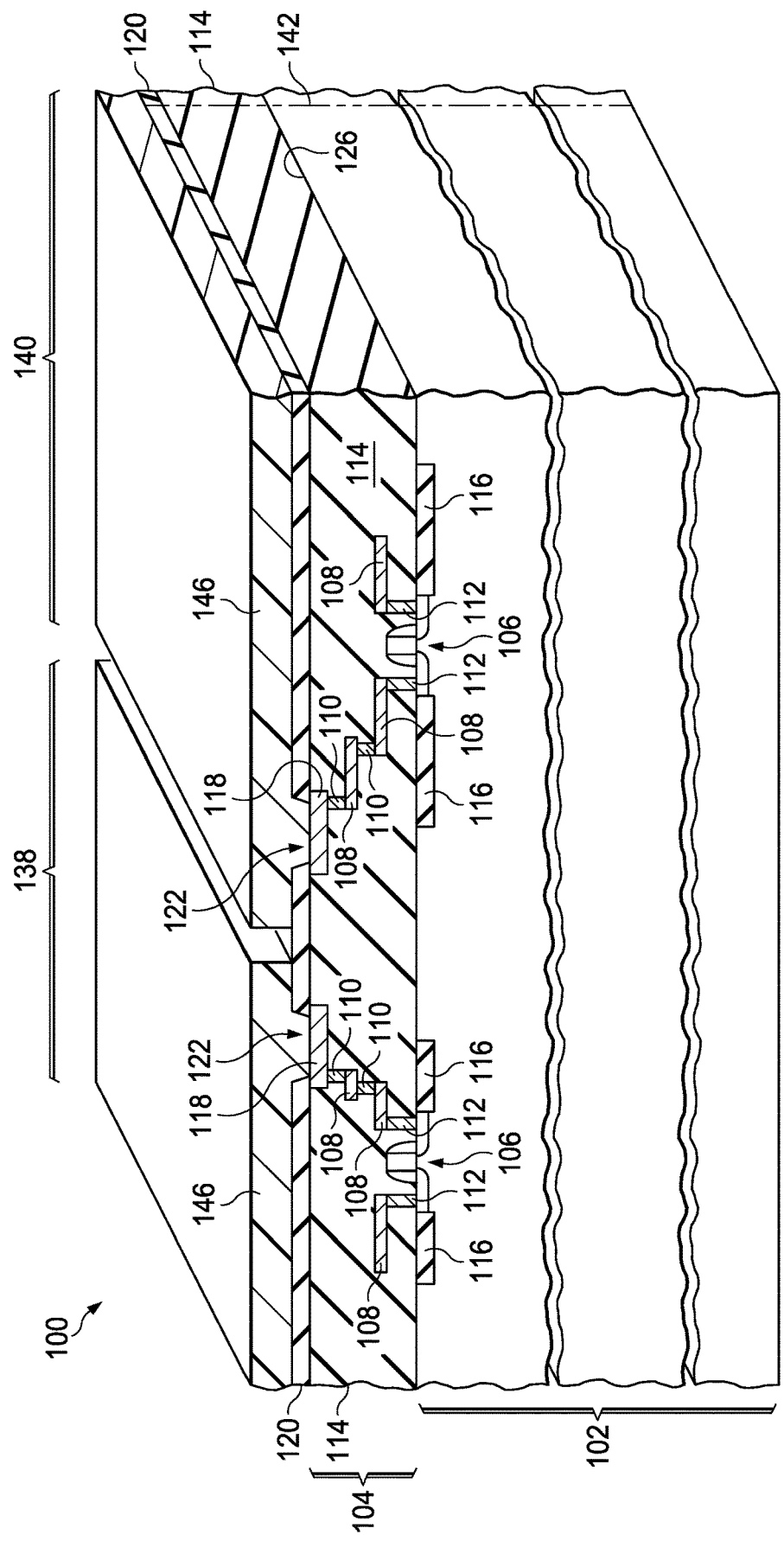
FIG. 2A through FIG. 2F are cross sections of the integrated circuit of FIG. 1, depicted in successive stages of an example method of formation.

FIG. 2A through FIG. 2F are cross sections of the integrated circuit of FIG. 1, depicted in successive stages of an example method of formation. Referring to FIG. 2A, the integrated circuit 100 is formed in and on the substrate 102. The substrate 102 may be, for example, part of a silicon wafer, a gallium arsenide wafer, or a silicon wafer with epitaxial layers of gallium aluminum nitride and gallium nitride. The substrate 102 at this stage of formation of the integrated circuit 100 may be, for example, 525 microns to 925 microns thick. The substrate includes the singulation zone 142 adjacent to the integrated circuit 100. The components 106 are formed at the top surface 126 of the substrate 102. The interconnect region 104, including the dielectric layers 114, the contacts 112, the interconnects 108 and the vias 110, is formed over the substrate 102 and the components 106. The dielectric layers 114, the contacts 112, the interconnects 108 and the vias 110 may be formed in successive layers. The contacts 112 may be formed in contact holes through a pre-metal dielectric (PMD) layer of the dielectric layers 114 and may include tungsten fill metal on a liner of titanium and titanium nitride, formed by deposition and etchback and/or chemical mechanical polish (CMP) processes. Alternatively, the contacts 112 may include aluminum extending into the contact holes from a first level of the interconnects 108. The interconnects 108 may include aluminum, formed over an inter-level dielectric (ILD) layer of the dielectric layers 114 by a reactive ion etch (RIE) process using chlorine radicals. Alternatively, the interconnects 108 may include copper, formed in an intra-metal dielectric (IMD) layer of the dielectric layers 114 by a damascene process. The vias 110 may include aluminum extending into via holes from a level of the interconnects 108, tungsten on metal liners in the via holes formed by deposition and etchback processes, or copper formed by damascene processes. The bond pads 118 are subsequently formed, electrically connected to the components 106 through the interconnects 108, the vias 110, and the contacts 112. Silicon dioxide in the PMD layer, IMD layers and ILD layers may be formed from tetraethyl orthosilicate (TEOS) by a plasma enhanced chemical vapor deposition (PECVD) process, or formed from thermal decomposition of an organic silane such as methyl-silsesquioxane (MSQ) or hydrogen-silsesquioxane (HSQ). The PMD layer, IMD layers and ILD layers may include cap layers of silicon nitride, silicon carbide, or silicon carbide nitride, and may include etch stop layers of silicon nitride, formed by PECVD processes. The bond pads 118 may include various metal layers, including, for example, copper, aluminum, nickel, palladium, and/or gold. The protective overcoat 120 is subsequently formed over the interconnect region 104, exposing the bond pads 118. The protective overcoat 120 may include a layer of an organic polymer dielectric material such as a photosensitive polyimide, patterned by a photolithographic process. The protective overcoat 120 may include one or more layers of inorganic dielectric material such as silicon dioxide, silicon nitride and/or silicon oxide nitride, patterned by an RIE process which removes dielectric material exposed by a photoresist mask. Other structures and materials for the dielectric layers 114, the contacts 112, the interconnects 108 and the vias 110, and methods of forming same, are within the scope of the instant example.

An isolation mask 146 is formed over the protective overcoat 120 and the bond pads 118, exposing an area for the isolation structure 124 of FIG. 1 and covering the areas for the isolated region 138 of the substrate 102 and the second portion 140 of the substrate 102. In one version of the instant example, the isolation mask 146 may include photoresist formed by a photolithographic process, and may possibly include an anti-reflection layer such as a bottom anti-reflection coat (BARC). In another version of the instant example, the isolation mask 146 may include one or more hard mask materials such as silicon nitride, silicon carbide, and/or amorphous carbon, and may be patterned by an RIE process which removes hard mask materials exposed by a photoresist mask. In the instant example, the area exposed by the isolation mask 146 may extend into the singulation zone 142.

Figure 2B:
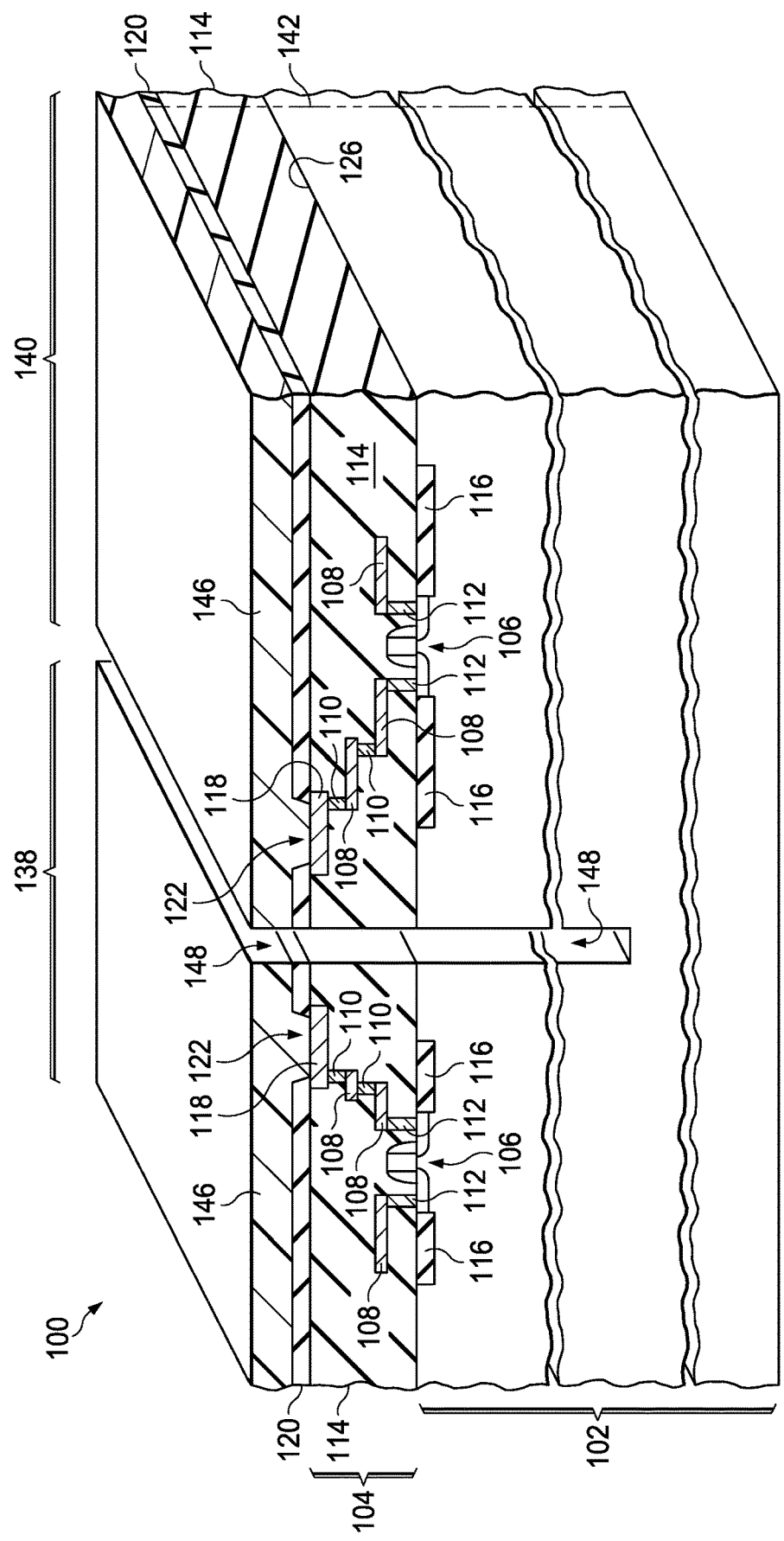

Referring to FIG. 2B, an isolation trench 148 is formed though the protective overcoat 120 and through the interconnect region 104, extending at least 40 microns deep into the substrate 102, in the area exposed by the isolation mask 146. At least 200 microns of substrate material remains in the substrate 102 under the isolation trench 148 when the isolation trench 148 is formed. The isolation trench 148 may be formed through the protective overcoat 120 and the interconnect region 104, for example, by a first RIE process using fluorine radicals to etch the dielectric materials. The isolation trench 148 may be formed through the substrate 102, for example, by a second RIE process using silicon hexafluoride ($SF_6$) and octafluorocyclobutane ($C_4F_8$) to etch the silicon semiconductor material. In the second RIE process, the $SF_6$ etches the silicon in the substrate 102 while the $C_4F_8$ passivates sidewalls of the isolation trench 148 to reduce unwanted lateral etching.

Figure 2C:
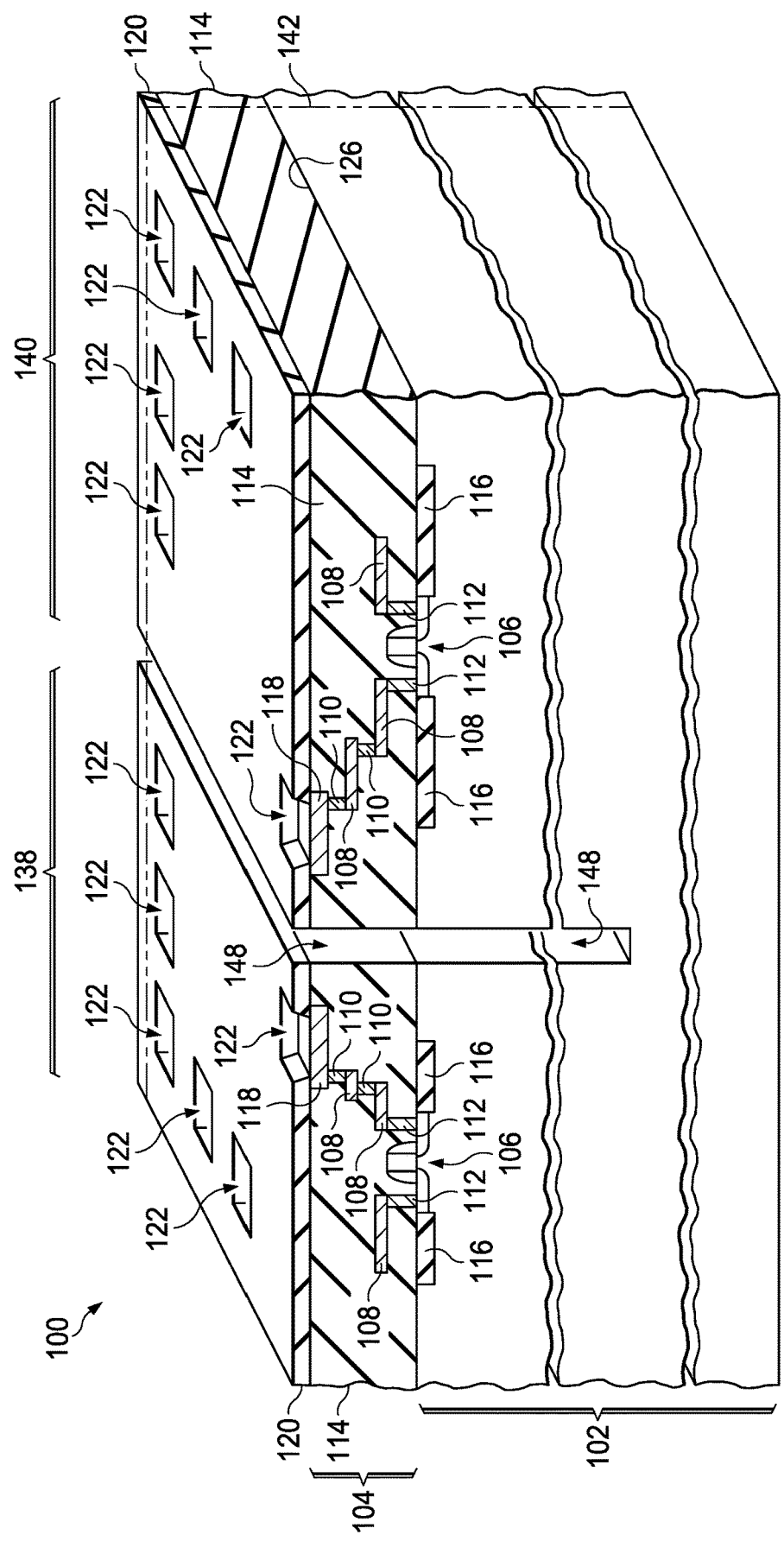

Referring to FIG. 2C, the isolation mask 146 of FIG. 2B is removed. Organic materials in the isolation mask 146 may be removed, for example, by an ash process. Inorganic materials in the isolation mask 146 may be removed, for example, by one or more plasma etch processes which are selective to the protective overcoat 120 and the bond pads 118. A trench liner of silicon dioxide may optionally be formed in the isolation trench 148, for example by a PECVD process.

Figure 2D:
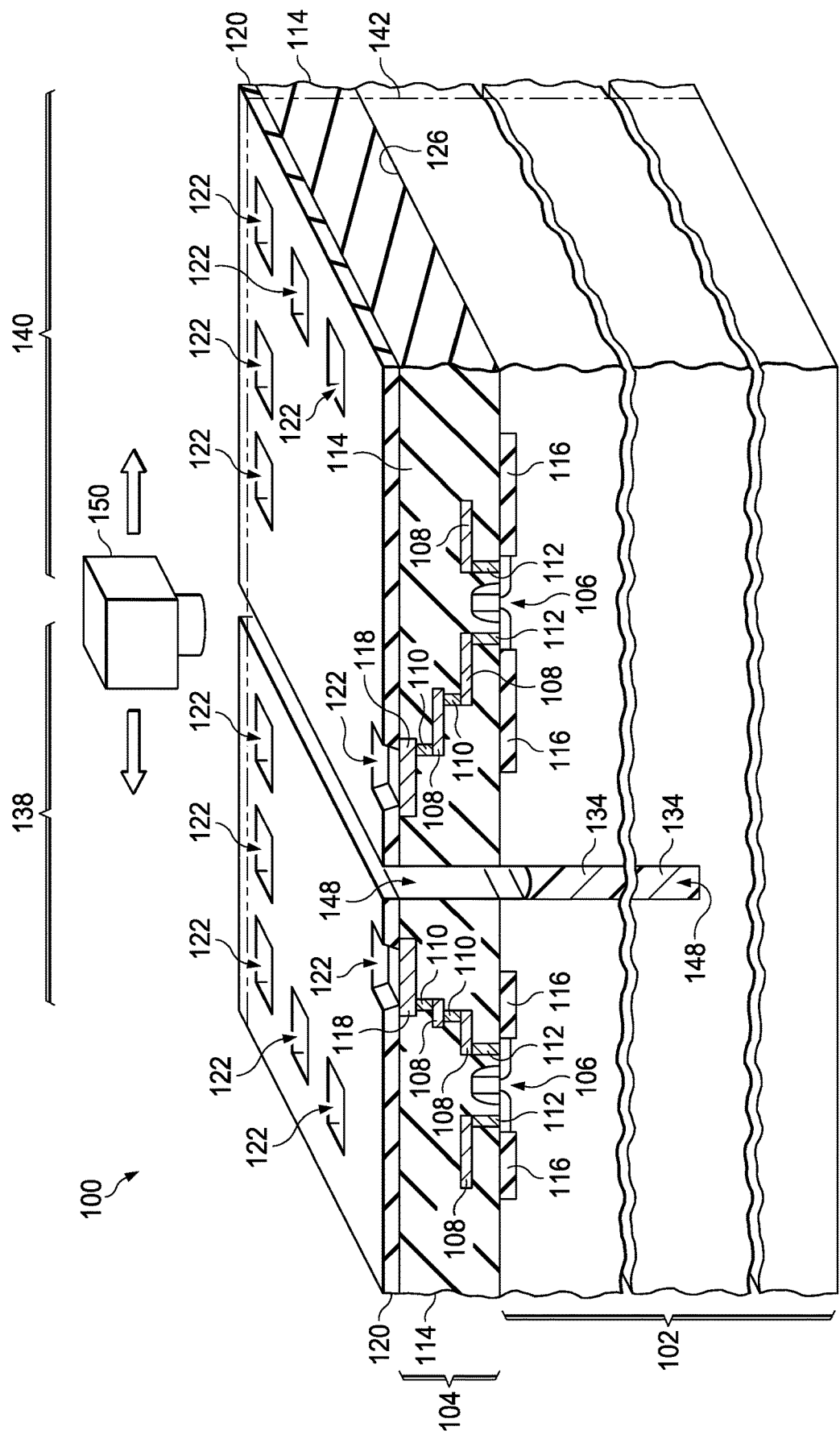

Referring to FIG. 2D, the isolation trench 148 is partially filled with the first dielectric material 134. The first dielectric material 134 may include, for example, an organic polymer such as epoxy or polyimide, a silicone polymer, an organic silane such as MSQ or HSQ, a sol gel or a ceramic slurry. In one version of the instant example, the first dielectric material 134 may be deposited into the isolation trench 148 by an inkjet apparatus 150, as depicted in FIG. 2D. Other methods of depositing the first dielectric material 134 into the isolation trench 148 are within the scope of the instant example. The first dielectric material may advantageously provide a desired adhesion to the substrate 102 and a desired low stress level on the substrate 102. The first dielectric material 134 may optionally be partially or completely cured before adding additional dielectric material to the isolation trench 148.

Figure 2E:
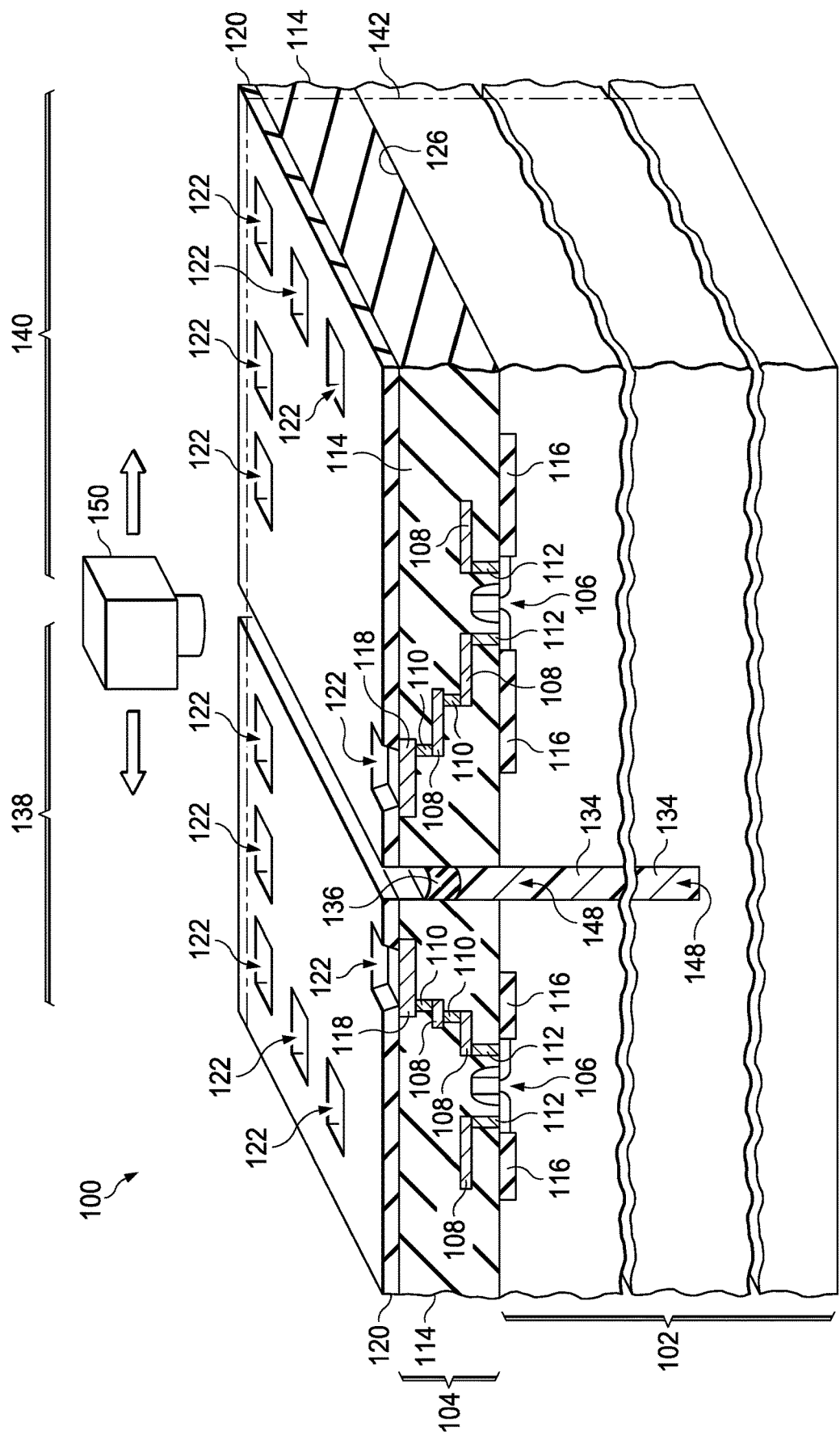

Referring to FIG. 2E, the remainder of the isolation trench 148 above the first dielectric material 134 is filled with the second dielectric material 136. The second dielectric material 136 may include similar or different material than the first dielectric material 134. The second dielectric material 136 may be deposited into the isolation trench 148 by the inkjet apparatus 150, as depicted in FIG. 2E. Other methods of depositing the second dielectric material 136 into the isolation trench 148 are within the scope of the instant example. The second dielectric material may advantageously provide a desired adhesion to the dielectric layers 114 of the interconnect region 104 and a desired low stress level on the interconnect region 104.

Figure 2F:
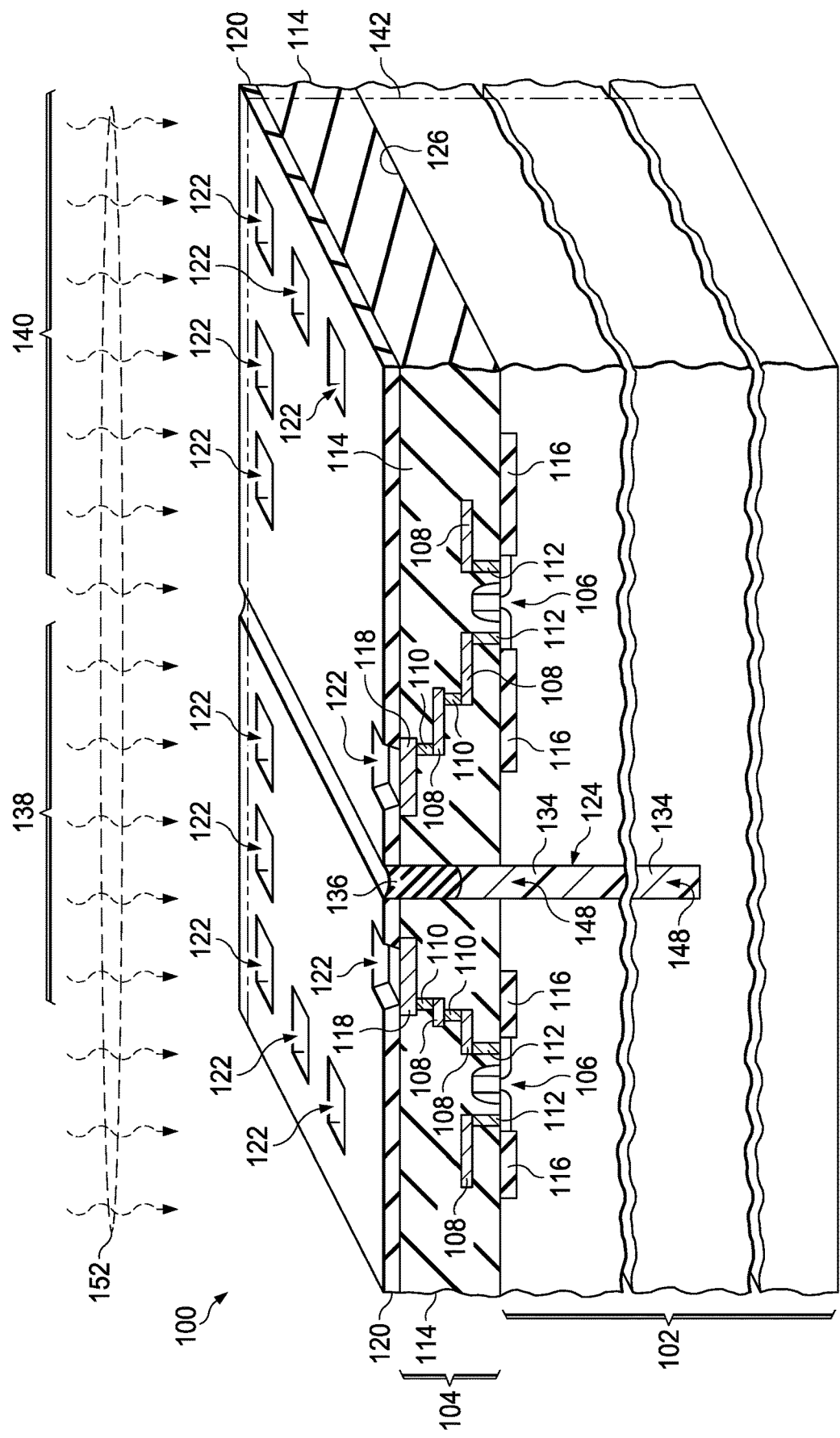

Referring to FIG. 2F, the dielectric material in the isolation trench 148, including the first dielectric material 134 and the second dielectric material 136 material, is cured by a thermal process 152 to form the isolation structure 124. The thermal process 152 may be, for example, a hot plate process or a radiant process as depicted in FIG. 2F. The thermal process 152 heats the integrated circuit 100 to a temperature no greater than 320° C., which may advantageously reduce degradation of the components 106, the contacts 112, the interconnects 108 and the vias 110, compared to forming an isolation structure at a higher temperature.

Figure 3A:
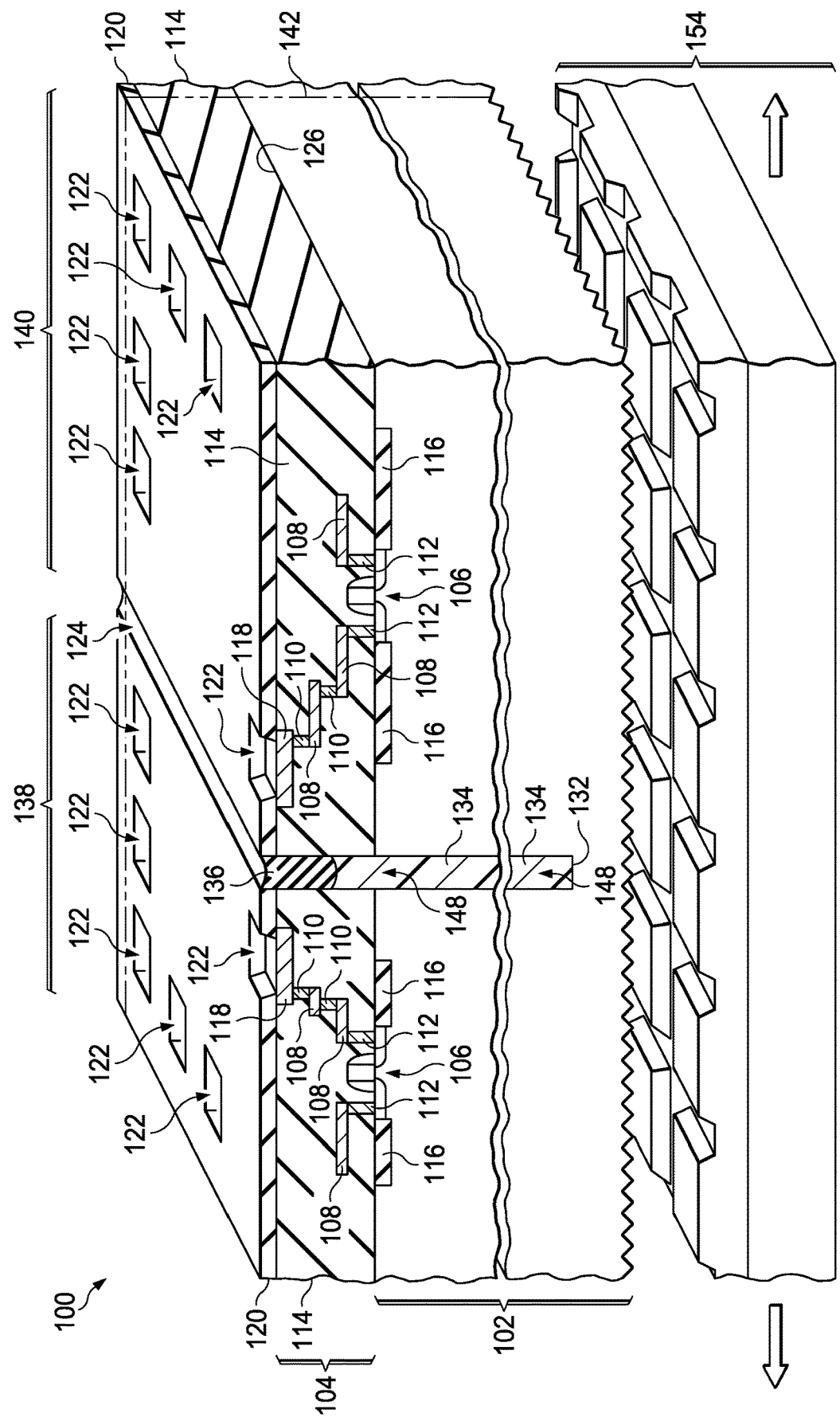
FIG. 3A and FIG. 3B are cross sections of the integrated circuit of FIG. 1, depicting successive stages of an example method of continued formation of the integrated circuit after the isolation structure is formed.
Figure 3B:
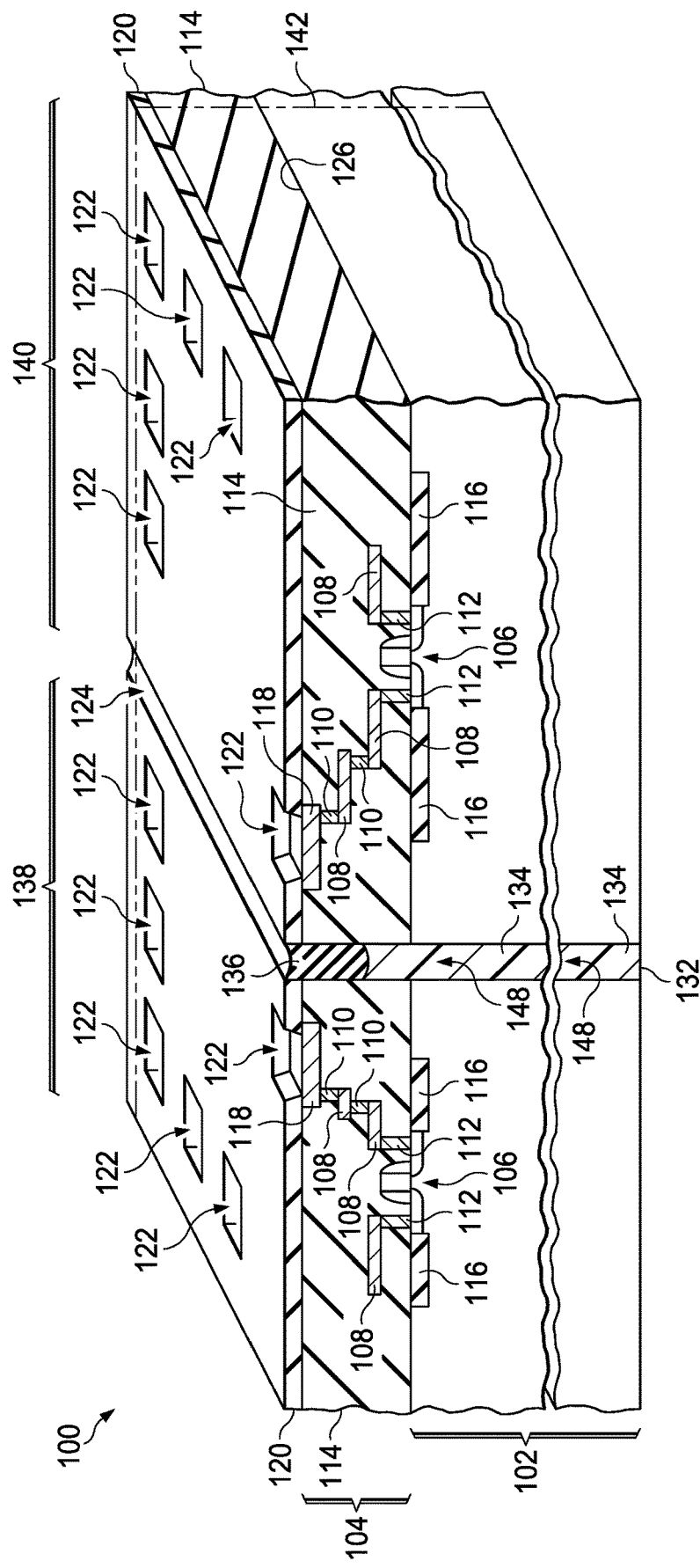

FIG. 3A and FIG. 3B are cross sections of the integrated circuit of FIG. 1, depicting successive stages of an example method of continued formation of the integrated circuit after the isolation structure is formed. Referring to FIG. 3A, substrate material is removed from the substrate 102 below the bottom 132 of the isolation structure 124, before the integrated circuit 100 is singulated. The substrate material may be removed by a backgrind process 154 as depicted in FIG. 3A. Alternatively, the substrate material may be removed by a planar etch process. While the substrate material is being removed, the dielectric material in the isolation structure 124, including the first dielectric material 134 and the second dielectric material 136, advantageously provides mechanical strength to the integrated circuit 100 to prevent breakage.

Referring to FIG. 3B, in one version of the instant example, enough of the substrate material may be removed from the substrate 102 below the isolation structure 124 to expose the bottom 132 of the isolation structure 124, thereby isolating the isolated region 138 of the substrate 102 from the second portion 140. The dielectric material in the isolation structure 124, including the first dielectric material 134 and the second dielectric material 136, advantageously holds the integrated circuit 100 together, allowing the integrated circuit 100 to be subsequently singulated and mounted into a package for assembly. The isolated region 138 and the second portion 140 of the substrate 102 may be biased to different operating potentials without significant current leakage through the substrate 102.

Figure 4:
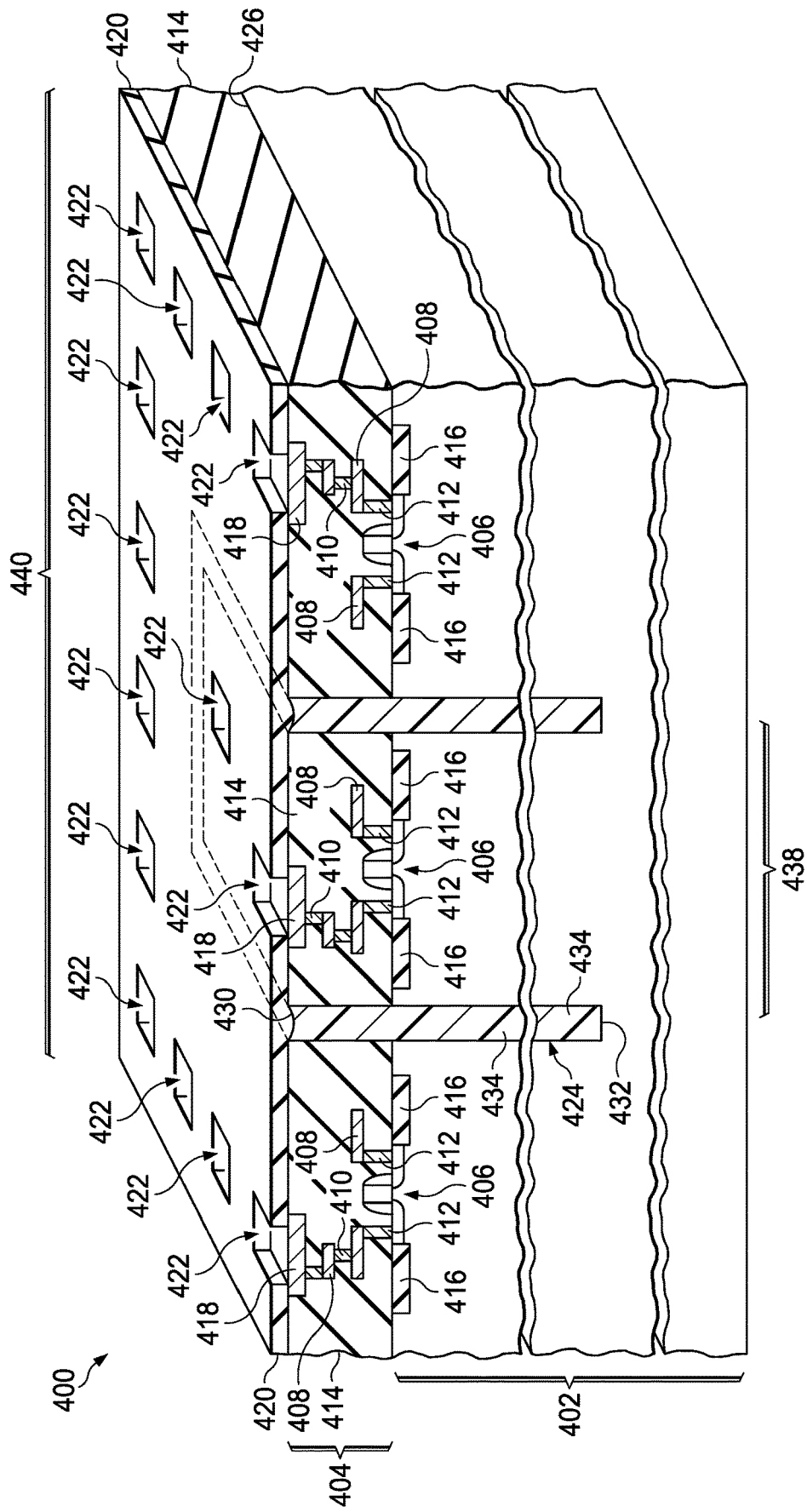
FIG. 4 is a cross section of another example integrated circuit with an isolation structure.

FIG. 4 is a cross section of another example integrated circuit with an isolation structure. The integrated circuit 400 includes a substrate 402 which includes semiconductor material for example as described in reference to FIG. 1. The integrated circuit 400 includes components 406 disposed at a top surface 426 of the substrate 402, possibly laterally separated by field oxide 416. The integrated circuit 400 includes an interconnect region 404 over a top surface 426 of the substrate 402; the interconnect region 404 includes interconnects 408, vias 410 between levels of the interconnects 408, and contacts 412 connecting the interconnects 408 to the components 406. The interconnects 408, vias 410 and contacts 412 are disposed in interconnect dielectric layers 414, for example as described in reference to FIG. 1. In the instant example, the integrated circuit 400 may include bond pads 418 and a protective overcoat 420 over the interconnect region 404 with openings 422 for the bond pads 418.

The integrated circuit 400 includes the isolation structure 424, which extends through at least a portion of the interconnect region 404 and at least 40 microns deep into the substrate 402 below a top surface 426 of the substrate 402 at a boundary between the substrate 402 and the interconnect region 404. In the instant example, the isolation structure 424 may extend through the complete interconnect region 404; the protective overcoat 420 is disposed over the isolation structure 424. The isolation structure 424 may have a width of, for example, 5 microns to 25 microns. The isolation structure 424 includes isolation dielectric material 434 contacting the substrate 402 and the interconnect region 404, extending from proximate to a top 430 of the isolation structure 424 to a bottom 432 of the isolation structure 424. In the instant example, the isolation structure 424 may have a closed-loop configuration, laterally surrounding and laterally isolating an isolated region 438, which is a first portion of the substrate 402 in the instant example, from a second portion 440 of the substrate 402 which laterally surrounds the isolation structure 424. The isolation structure 424 may advantageously provide a reduced cost for an application using the integrated circuit 400 compared to a similar application using two separate integrated circuits for the isolated region 438 and the second portion 440 of the substrate 402. One or more of the components 406 in the isolated region 438 may be electrically coupled, for example through a capacitor or an inductor, to one or more of the components 406 in the second portion 440.

Figure 5A:
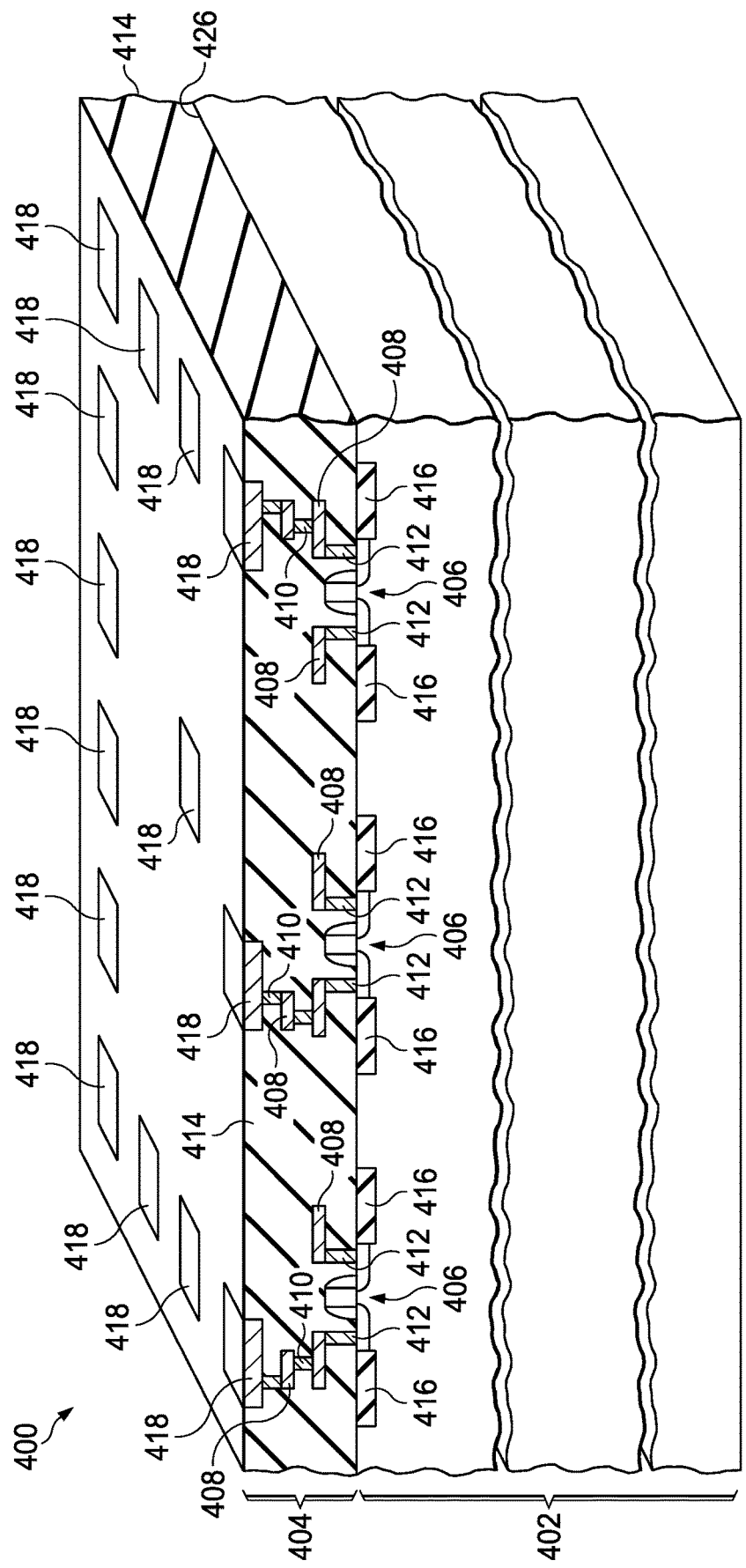
FIG. 5A through FIG. 5I are cross sections of the integrated circuit of FIG. 4, depicted in successive stages of an example method of formation.

FIG. 5A through FIG. 5I are cross sections of the integrated circuit of FIG. 4, depicted in successive stages of an example method of formation. Referring to FIG. 5A, the integrated circuit 400 is formed in and on the substrate 402. The field oxide 416 is formed in the substrate 402, for example by a shallow trench isolation (STI) process or a localized oxidation of silicon (LOCOS) process. The components 406 are formed at the top surface 426 of the substrate 402. The interconnect region 404 is formed over the substrate 402 and the components 406. The dielectric layers 414 may include a PMD layer, ILD layers and IMD layers. The contacts 412, the interconnects 408, the vias 410 and the bond pads 418 are formed in the dielectric layers 414, for example as described in reference to FIG. 2A. In the instant example, the protective overcoat 420 of FIG. 4 may optionally not be formed until after formation of the isolation structure 424 of FIG. 4, so that the bond pads 418 are exposed at the instant stage of formation of the integrated circuit 400.

Figure 5B:
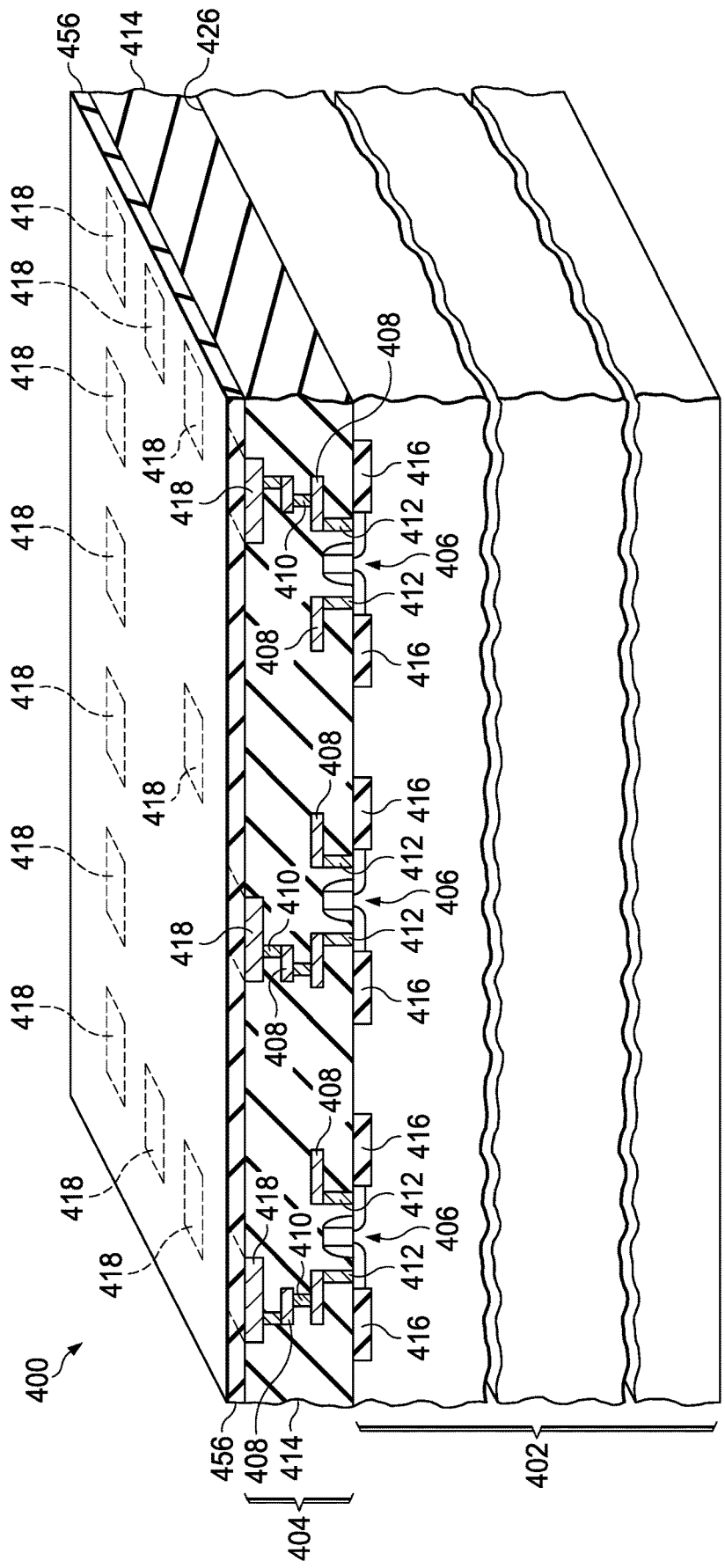

Referring to FIG. 5B, a sacrificial protective layer 456 is formed over the bond pads 418 and over the dielectric layers 414. The sacrificial protective layer 456 may include silicon dioxide or silicon nitride, formed by a low temperature PECVD process using dichlorosilane and ammonia to provide a desired etch selectivity to the bond pads 418 and the dielectric layers 414. For example, the sacrificial protective layer 456 may be formed while the integrated circuit 400 is at a temperature less than 320° C. The sacrificial protective layer 456 may be, for example, 20 nanometers to 500 nanometers thick.

Figure 5C:
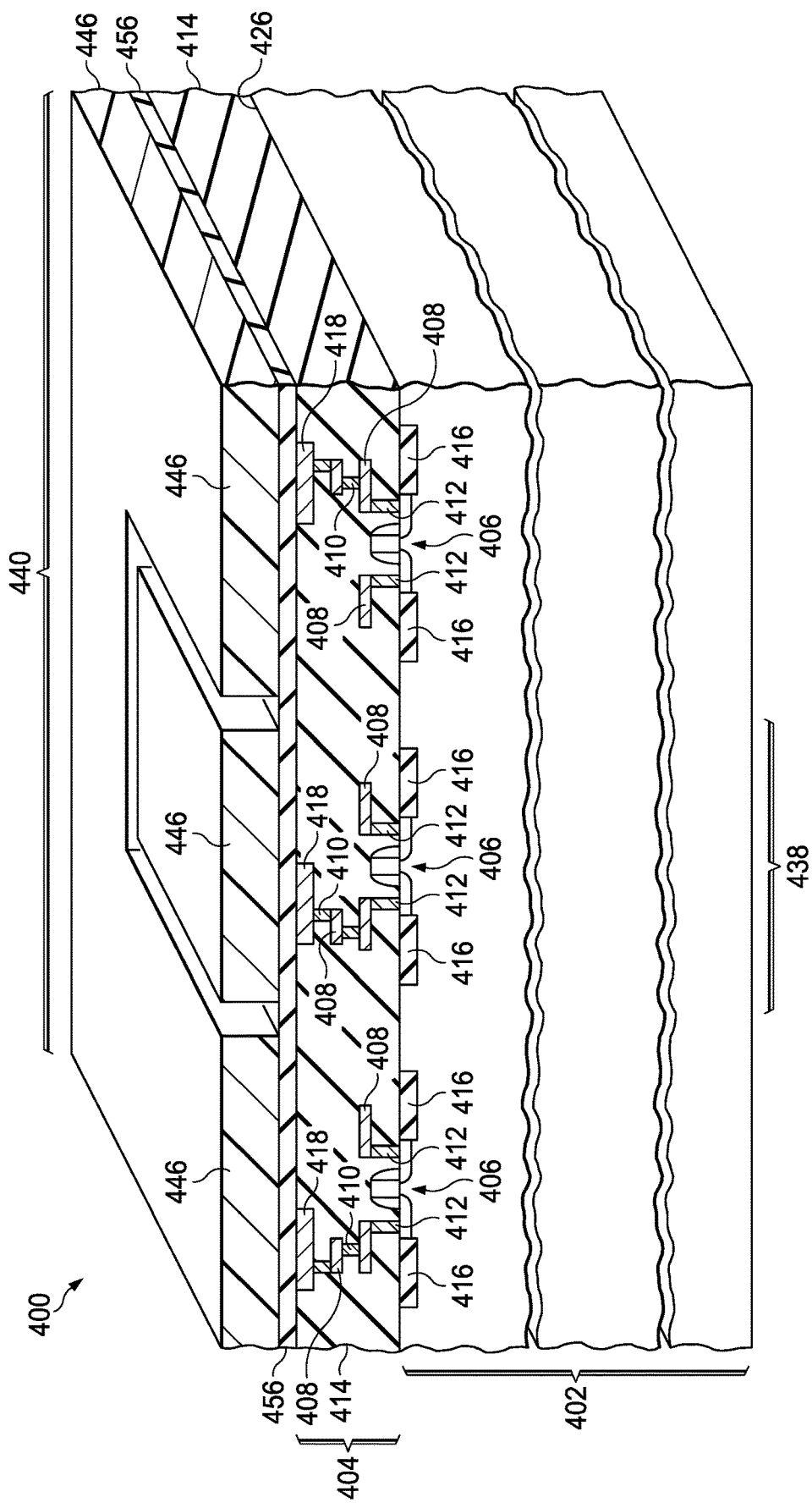

Referring to FIG. 5C, an isolation mask 446 is formed over the bond pads 418 and the dielectric layers 414, exposing an area for the isolation structure 424 of FIG. 4 and covering the areas for the isolated region 438 of the substrate 402 and the second portion 440 of the substrate 402. The isolation mask 446 may include photoresist formed by a photolithographic process, and may include one or more hard mask materials.

Figure 5D:
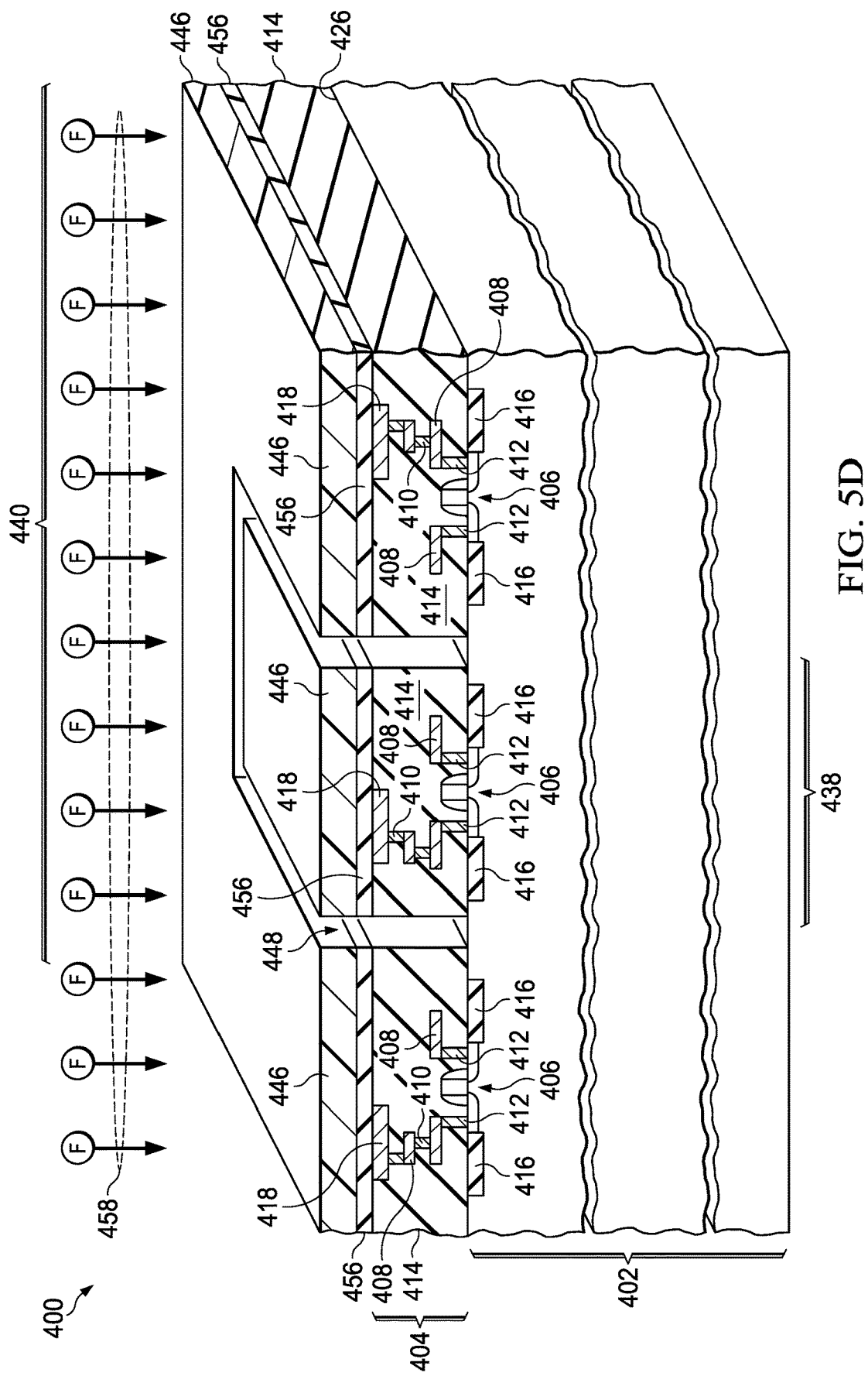

Referring to FIG. 5D, a first portion of an isolation trench 448 is formed though the sacrificial protective layer 456 and through the interconnect region 404, stopping proximate to the top surface 426 of the substrate 402, in the area exposed by the isolation mask 446. The first portion of the isolation trench 448 may be formed through the sacrificial protective layer 456 and the interconnect region 404 by a first RIE process 458 using fluorine radicals, as depicted in FIG. 5D, to etch the dielectric materials. The isolation mask 446 may be partially eroded by the first RIE process 458, as depicted in FIG. 5D.

Figure 5E:
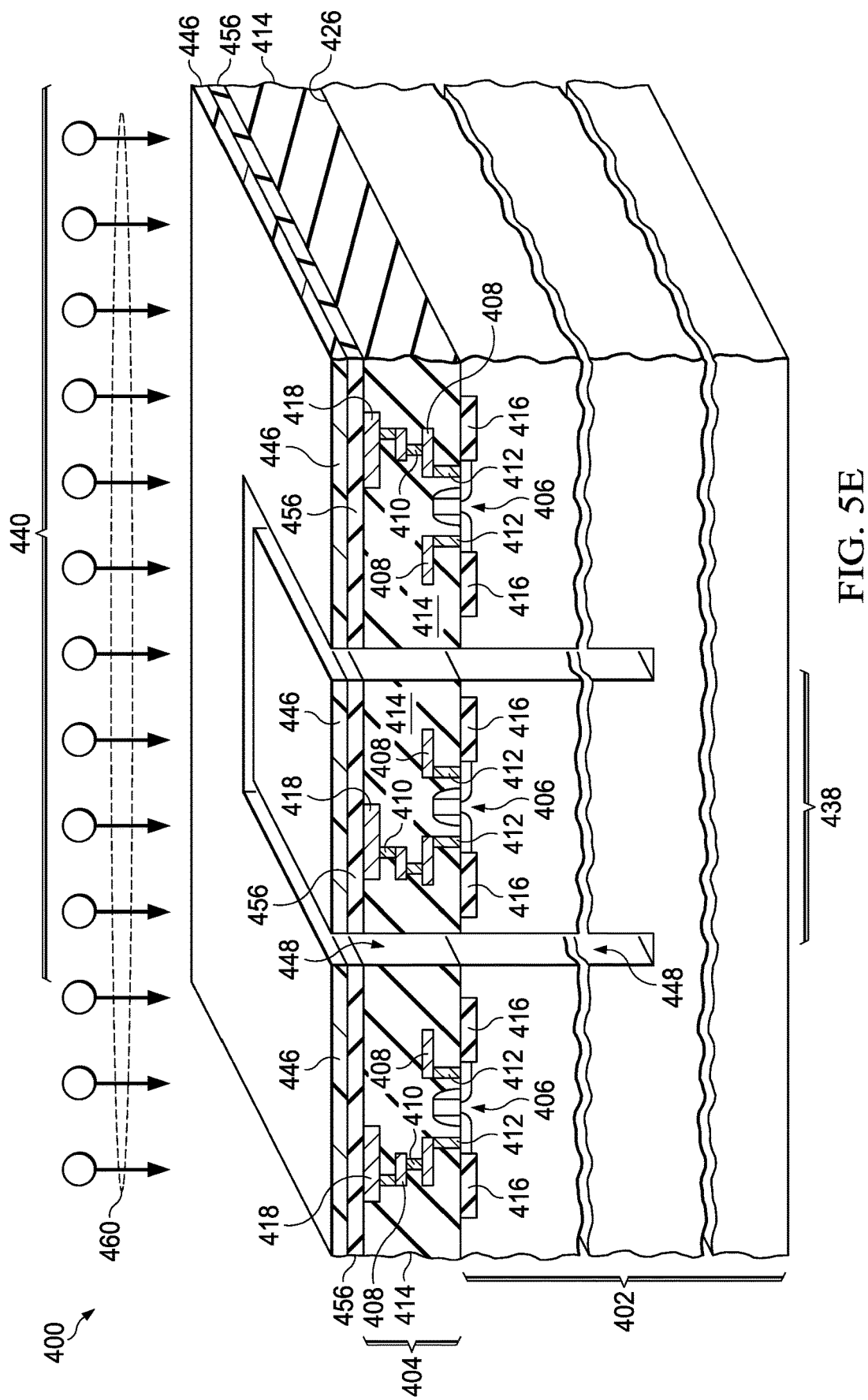

Referring to FIG. 5E, a remaining portion of the isolation trench 448 is formed in the area exposed by the isolation mask 446, extending at least 40 microns deep into the substrate 402. At least 200 microns of substrate material remains in the substrate 402 under the isolation trench 448 when the isolation trench 448 is formed. The remaining portion of the isolation trench 448 may be formed into the substrate 402 by a second RIE process 460 using $SF_6$ and $C_4F_8$, as depicted in FIG. 5E, to etch silicon. The isolation mask 446 may be additionally eroded by the second RIE process 460, as depicted in FIG. 5E. In the instant example, the isolation mask 446 may optionally not be removed until after the isolation trench 448 is filled. In an alternative version, the isolation mask 446 may be removed before proceeding to a subsequent step.

Figure 5F:
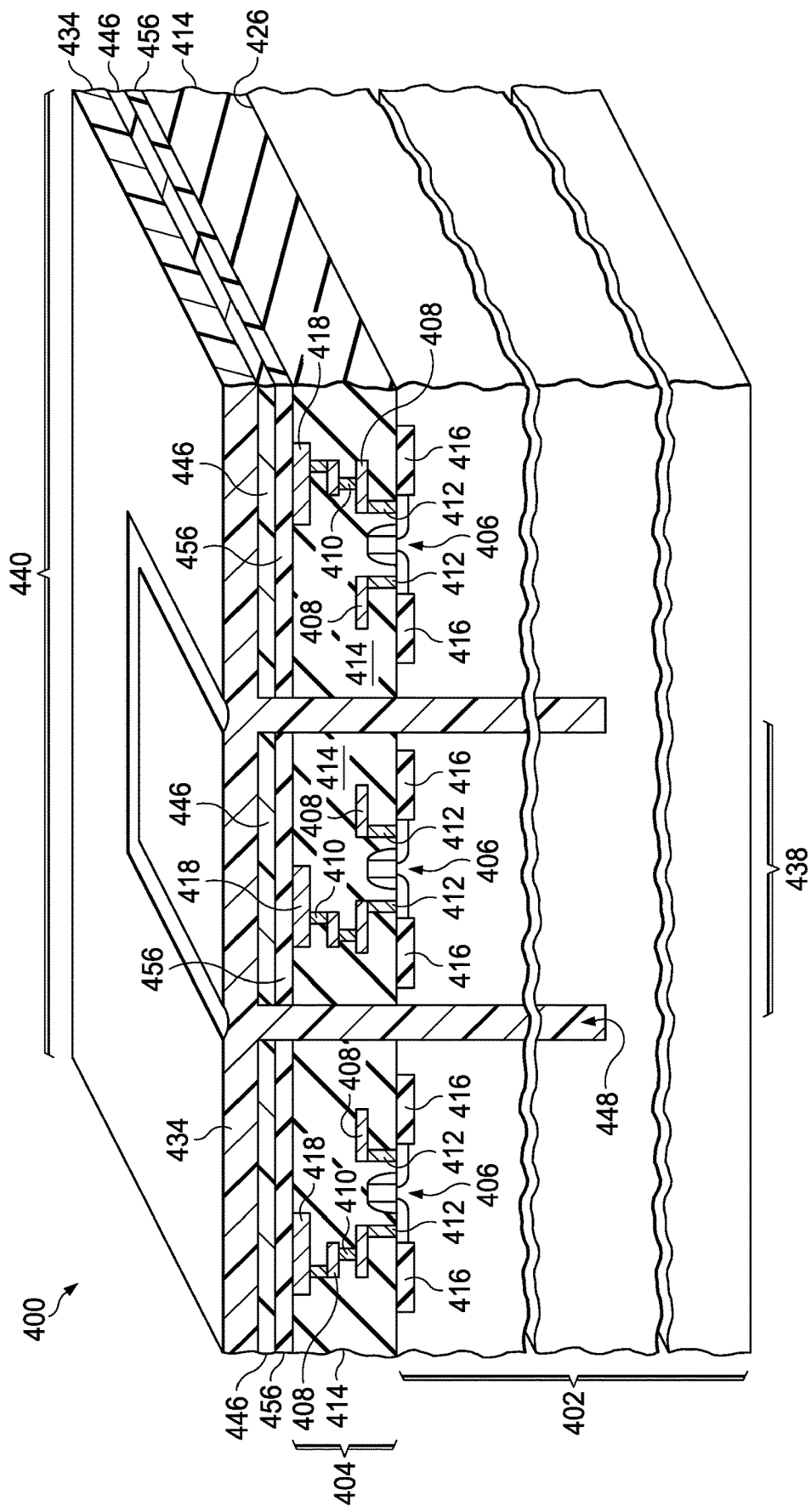

Referring to FIG. 5F, the isolation trench 448 is filled with dielectric material 434. In the instant example, the dielectric material 434 may be provided to the isolation trench 448 as a liquid by a spin-coat process. The dielectric material 434 covers the isolation mask 446 and the sacrificial protective layer 456. The dielectric material 434 may include, for example, epoxy, polyimide, MSQ, HSQ, a sol gel or a ceramic slurry. In some versions of the instant example, the dielectric material 434 may include solvent which is subsequently removed.

Figure 5G:
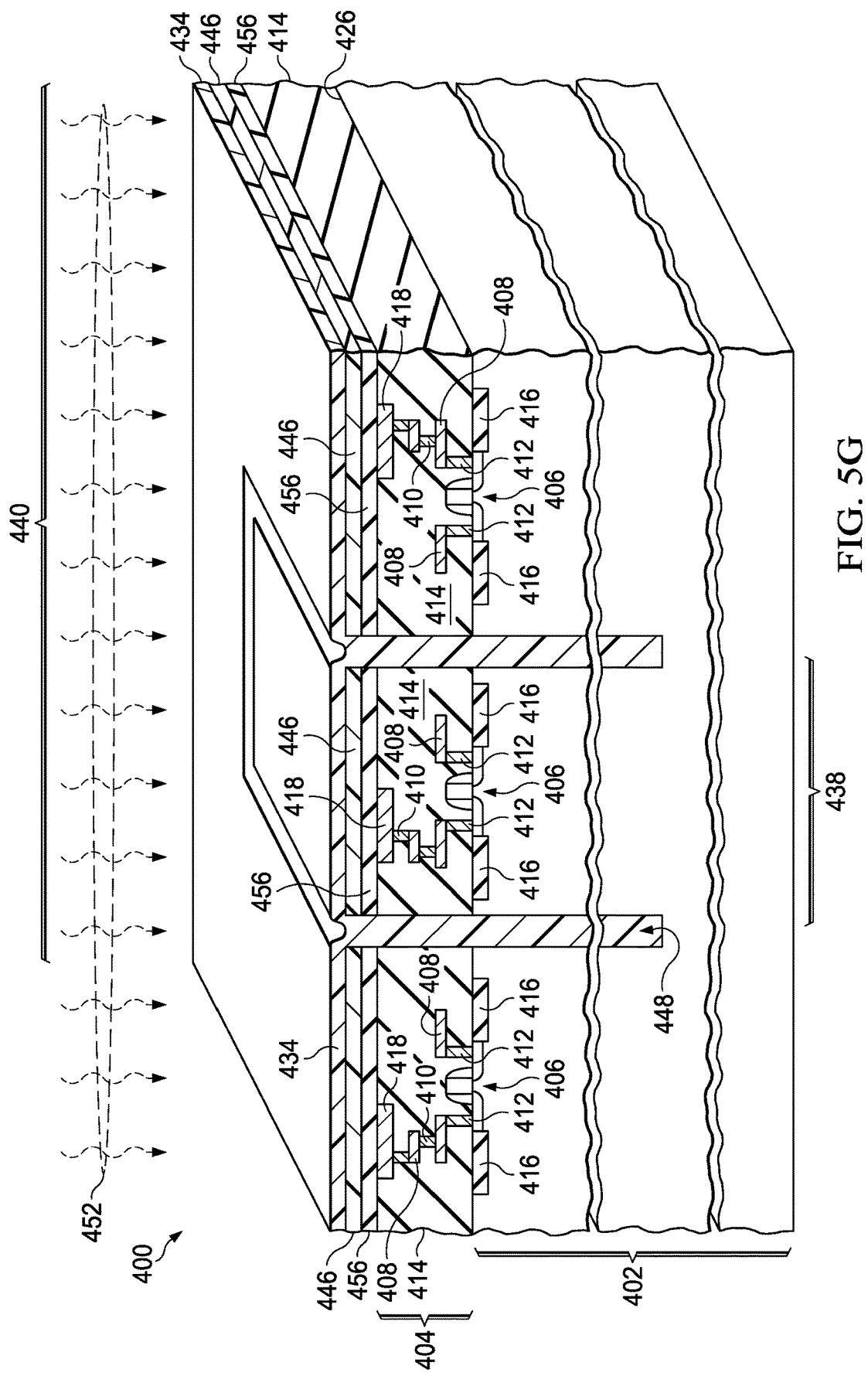

Referring to FIG. 5G, the dielectric material 434 in the isolation trench 448 is cured by a thermal process 452. The thermal process 452 may be, for example, a hot plate process or a radiant process. The thermal process 452 heats the integrated circuit 400 to a temperature no greater than 320° C., which may advantageously reduce degradation of the components 406, the contacts 412, the interconnects 408 and the vias 410, compared to forming an isolation structure at a higher temperature.

Figure 5H:
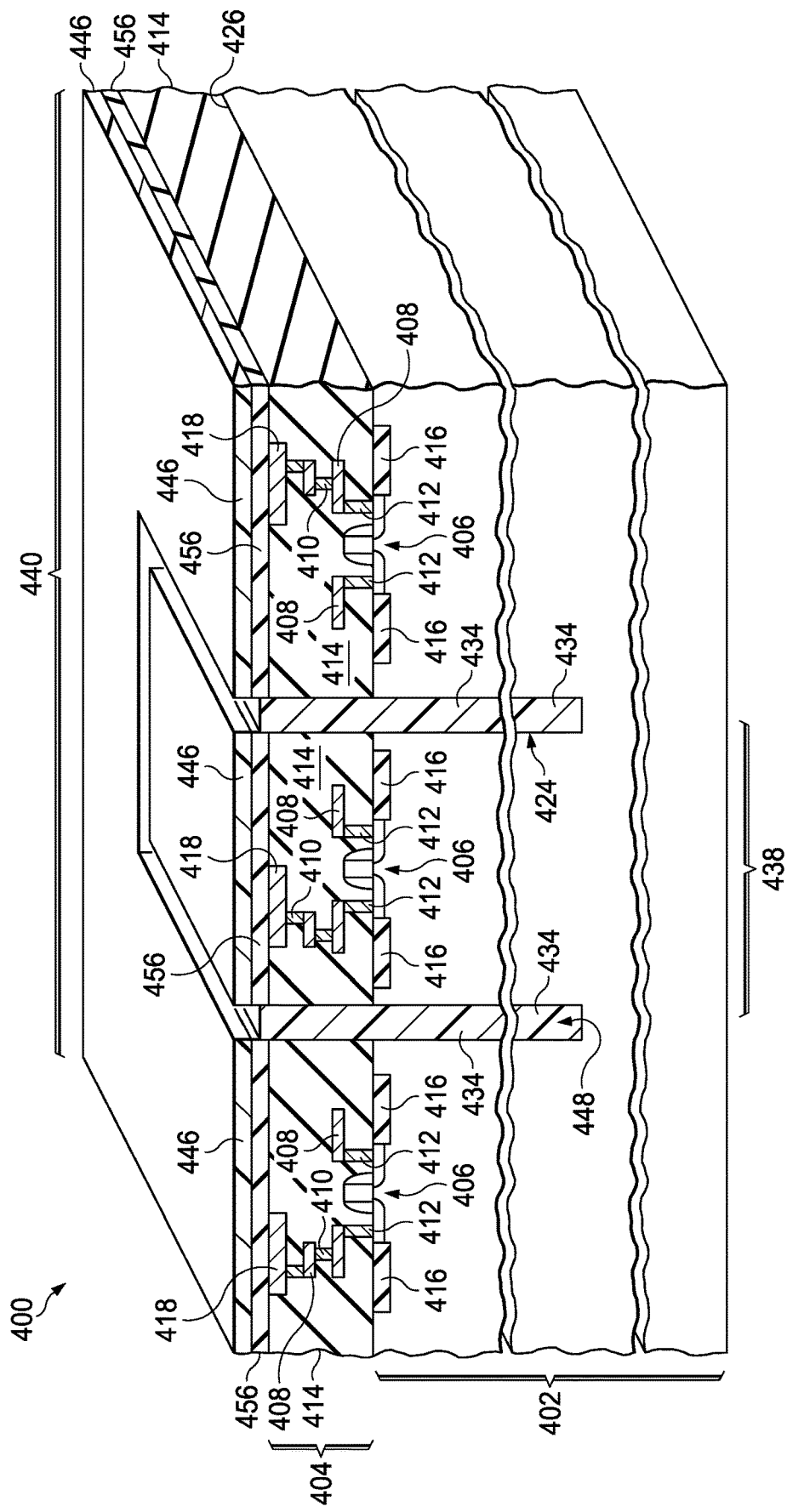

Referring to FIG. 5H, the dielectric material 434 is removed from over the isolation mask 446 and the sacrificial protective layer 456, leaving the dielectric material 434 in the isolation trench 448 to form the isolation structure 424. In one version of the instant example, the dielectric material 434 may be removed by an isotropic etch process such as a plasma etch process or a wet etch process. In another version, the dielectric material 434 may be removed by a CMP process. The sacrificial protective layer 456, and the remaining isolation mask 446 if present, protects the bond pads 418 during removal of the dielectric material 434. The dielectric material 434 may optionally be recessed below a top surface of the sacrificial protective layer 456, proximate to a top surface of the dielectric layers 414 of the interconnect region 404.

Figure 5I:
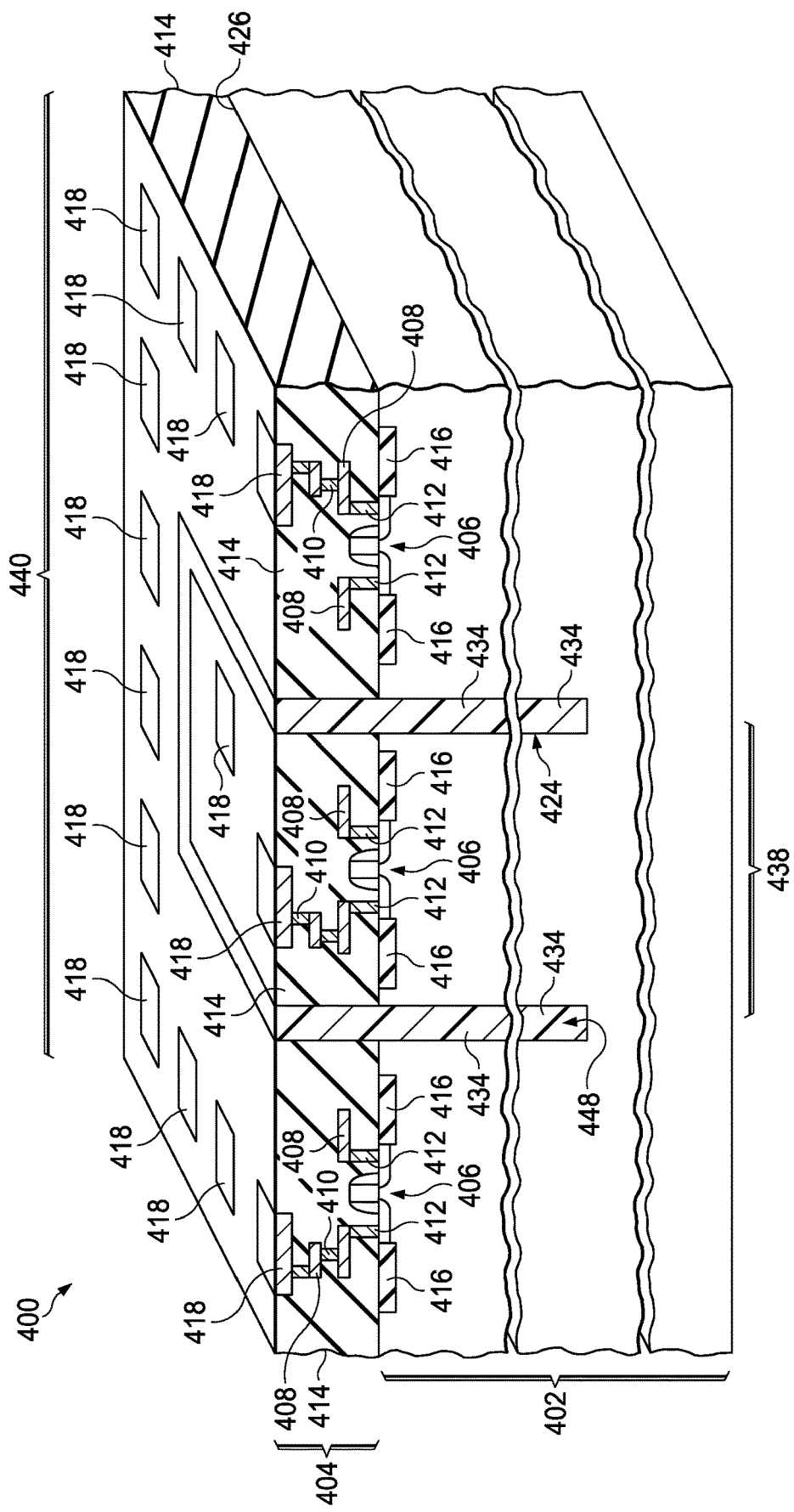

Referring to FIG. 5I, the remaining portion of the isolation mask 446, if present, and the sacrificial protective layer 456 of FIG. 5H are removed, exposing the bond pads 418. The remaining portion of the isolation mask 446 may be removed by a plasma etch, followed by a wet clean process. The sacrificial protective layer 456 may be removed by a plasma etch which is selective to the bond pads 418 and the dielectric layers 414. Forming the sacrificial protective layer 456 at a low temperature as described in reference to FIG. 5B may advantageously facilitate its removal with reduced damage to the bond pads 418 and the dielectric layers 414, compared to a protective layer formed at higher temperature. Subsequently, the protective overcoat 420 of FIG. 4 is formed to provide the structure of FIG. 4. In an alternative version of the instant example, a portion of the sacrificial protective layer 456 may be left on the integrated circuit 400 and patterned with the protective overcoat 420 to become a permanent element of the integrated circuit 400.

Figure 6A:
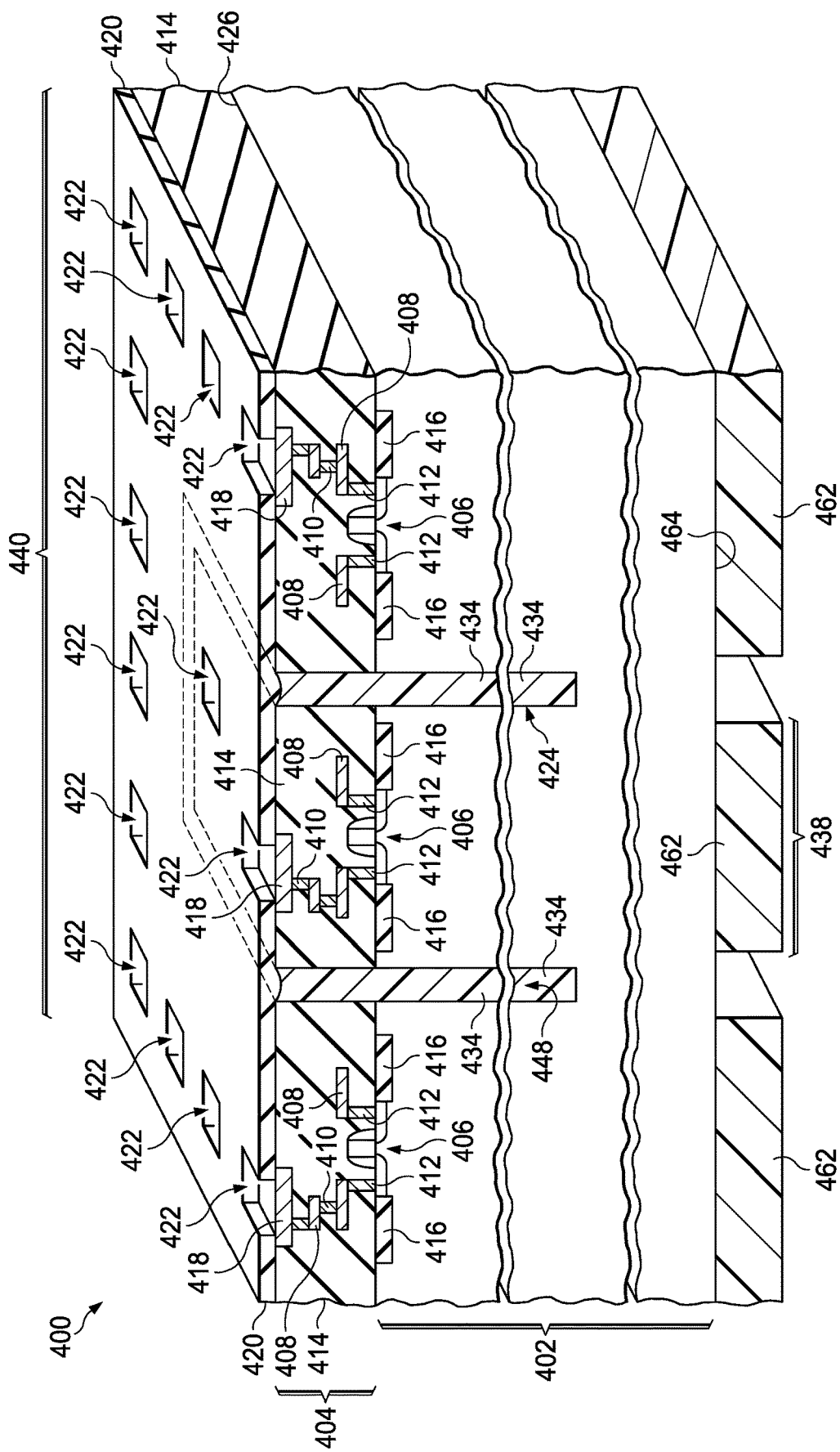
FIG. 6A through FIG. 6D are cross sections of the integrated circuit of FIG. 4, depicting successive stages of an example method of continued formation of the integrated circuit after the isolation structure is formed.

FIG. 6A through FIG. 6D are cross sections of the integrated circuit of FIG. 4, depicting successive stages of an example method of continued formation of the integrated circuit after the isolation structure is formed. Referring to FIG. 6A, a backside isolation mask 462 is formed on a bottom surface 464 of the substrate 402 before the integrated circuit 400 is singulated. The backside isolation mask 462 exposes an area under the isolation structure 424 and covers an area under the isolated region 438 of the substrate 402 and an area under the second portion 440 of the substrate 402. The backside isolation mask 462 may be formed as disclosed in U.S. patent application Ser. No. 14/701,484, which is incorporated by reference.

Figure 6B:
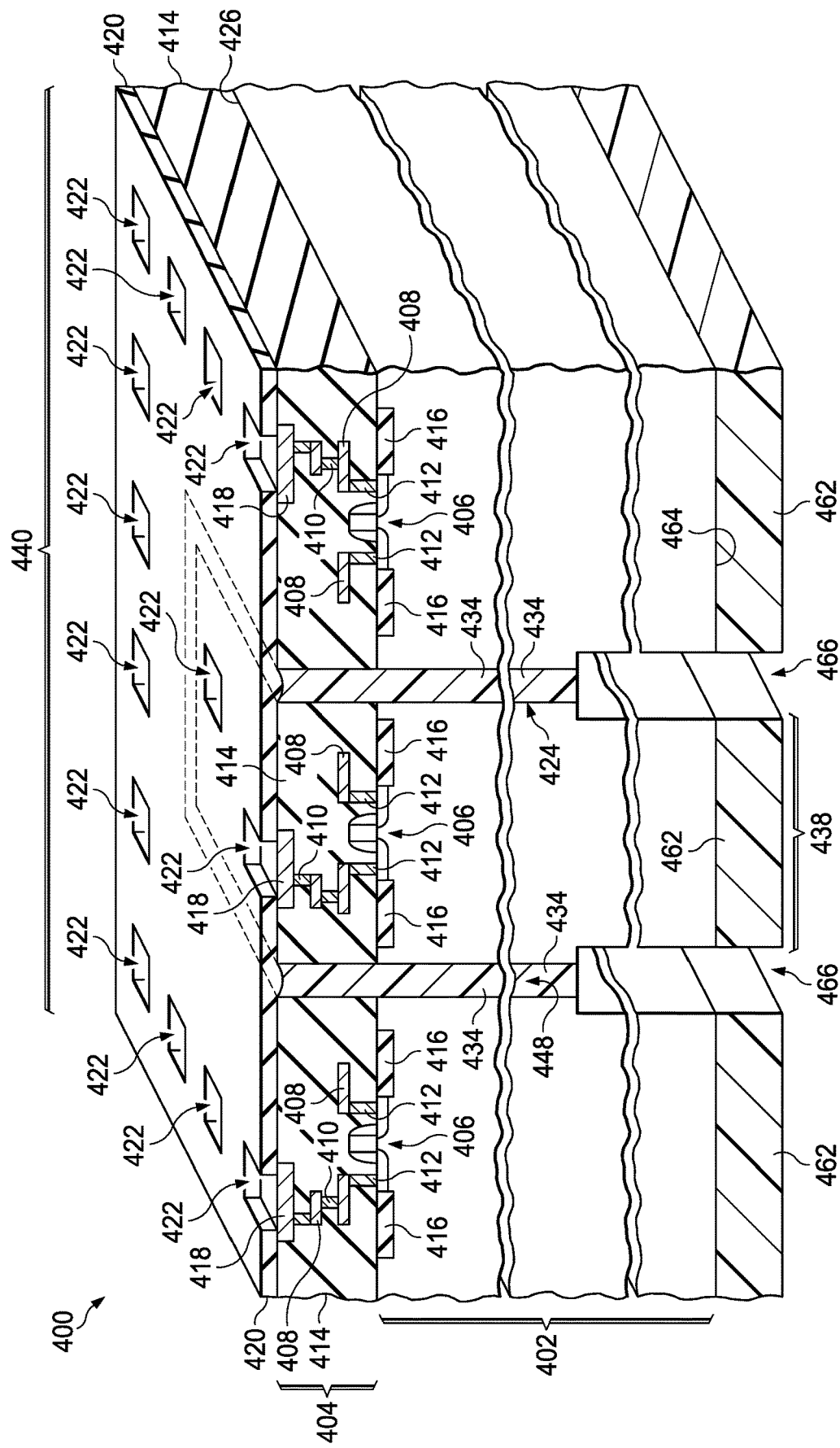

Referring to FIG. 6B, substrate material is removed from the substrate 402 from the bottom surface 464 up to the isolation structure 424 in the area exposed by the backside isolation mask 462 to form a backside isolation trench 466 which exposes the isolation structure 424. The substrate material may be removed by a deep RIE process such as disclosed in U.S. patent application Ser. No. 14/701,484. The deep RIE process may use endpoint signals to stop the etch process when the isolation structure 424 is exposed. Alternatively, the deep RIE process may be a timed process.

Figure 6C:
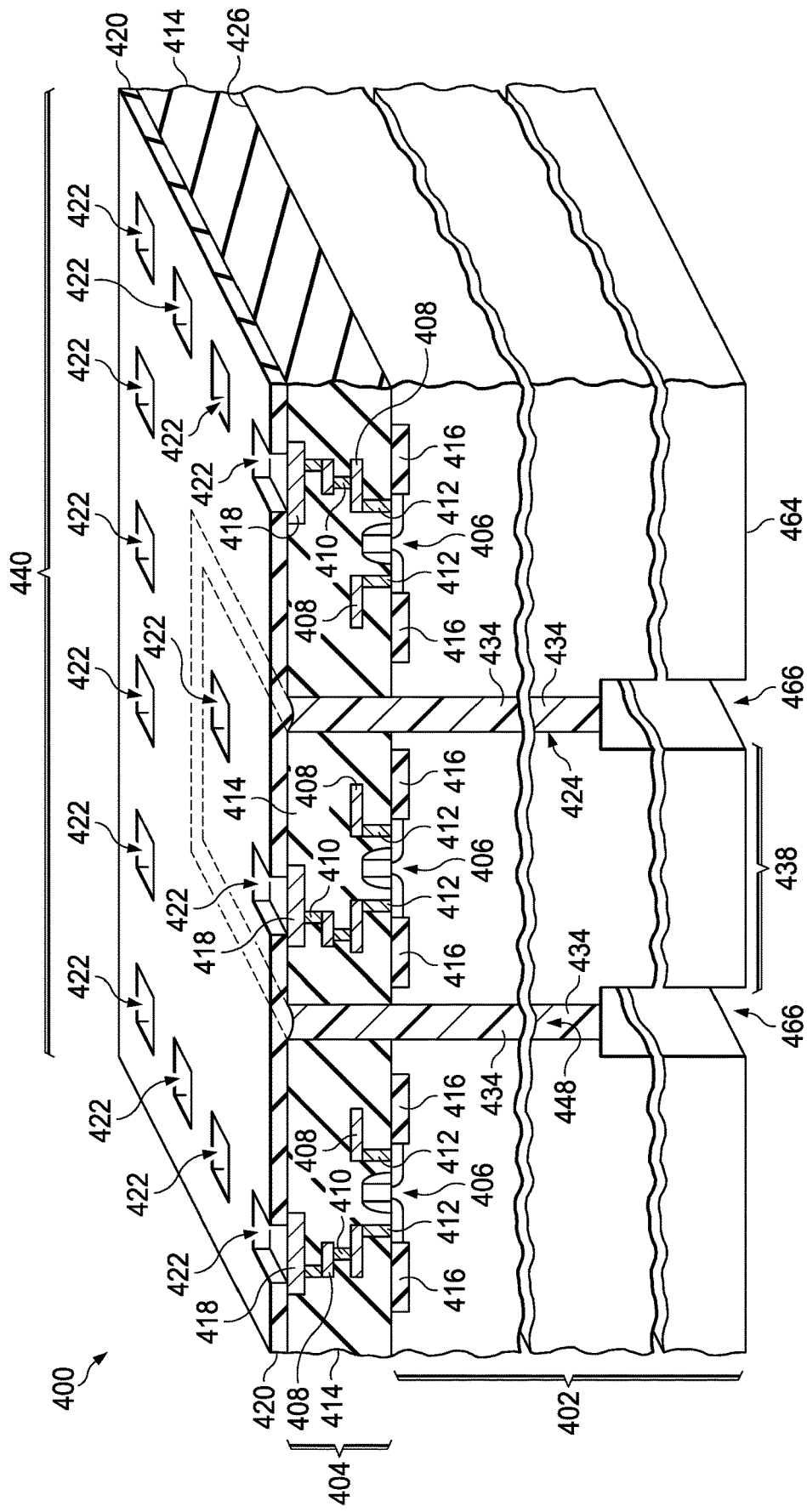

Referring to FIG. 6C, the backside isolation mask 462 of FIG. 6B is removed. The backside isolation trench 466 combined with the isolation structure 424 isolates the isolated region 438 of the substrate 402 from the second portion 440. The backside isolation mask 462 may be removed as disclosed in U.S. patent application Ser. No. 14/701,484.

Figure 6D:
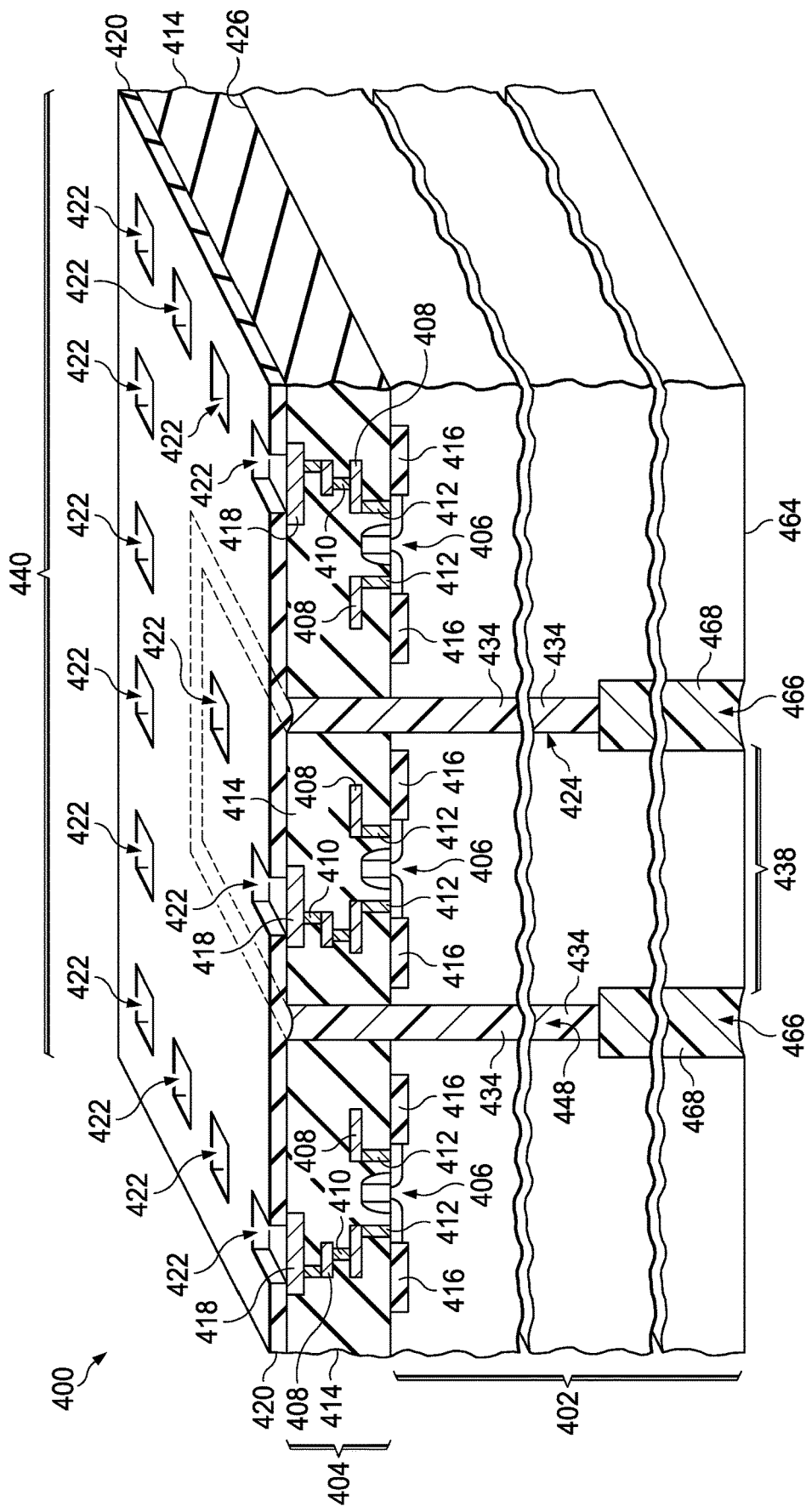

Referring to FIG. 6D, dielectric material 468 is formed in the backside isolation trench 466, contacting the isolation structure 424. The dielectric material 468 may be formed as disclosed in U.S. patent application Ser. No. 14/701,484. The dielectric material 468 may advantageously provide desired mechanical strength to the substrate 402 during subsequent singulation of the integrated circuit 400 while effecting isolation of the isolated region 438 of the substrate 402 from the second portion 440.

Figure 7A:
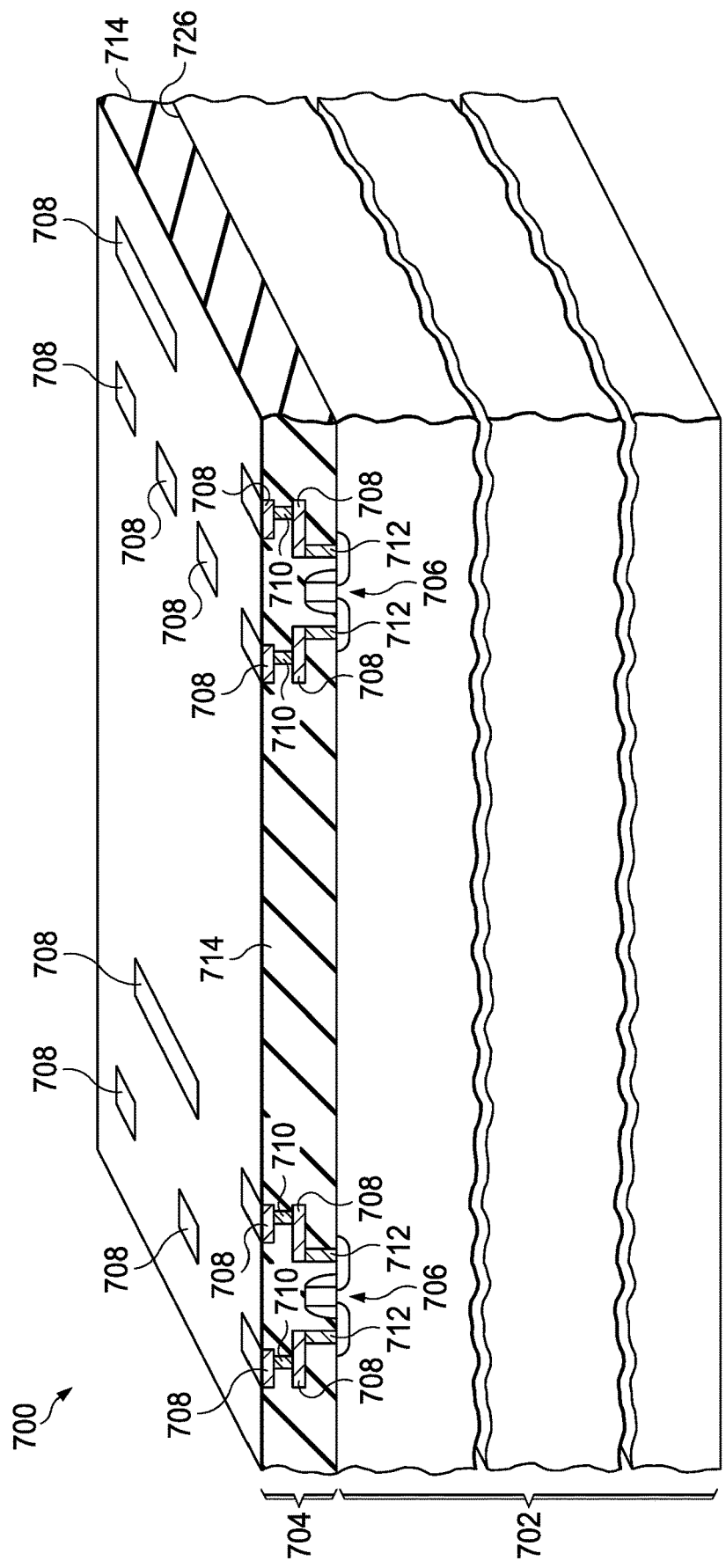
FIG. 7A through FIG. 7G are cross sections of another example integrated circuit with an isolation structure, depicted in successive stages of an example method of formation.

FIG. 7A through FIG. 7G are cross sections of another example integrated circuit with an isolation structure, depicted in successive stages of an example method of formation. Referring to FIG. 7A, the integrated circuit 700 includes a substrate 702 comprising a semiconductor material, for example a semiconductor wafer. Components 706 are formed at a top surface 726 of the substrate 702. A first portion 704 of an interconnect region is formed over the top surface 726 of the substrate 702 and over the components 706. The first portion 704 of the interconnect region includes a stack of dielectric layers 714, and contacts 712, interconnects 708 and possibly vias 710 formed in the dielectric layers 714. Some of the interconnects 708 may be exposed at this stage of formation of the integrated circuit 700, as depicted in FIG. 7A.

Figure 7B:
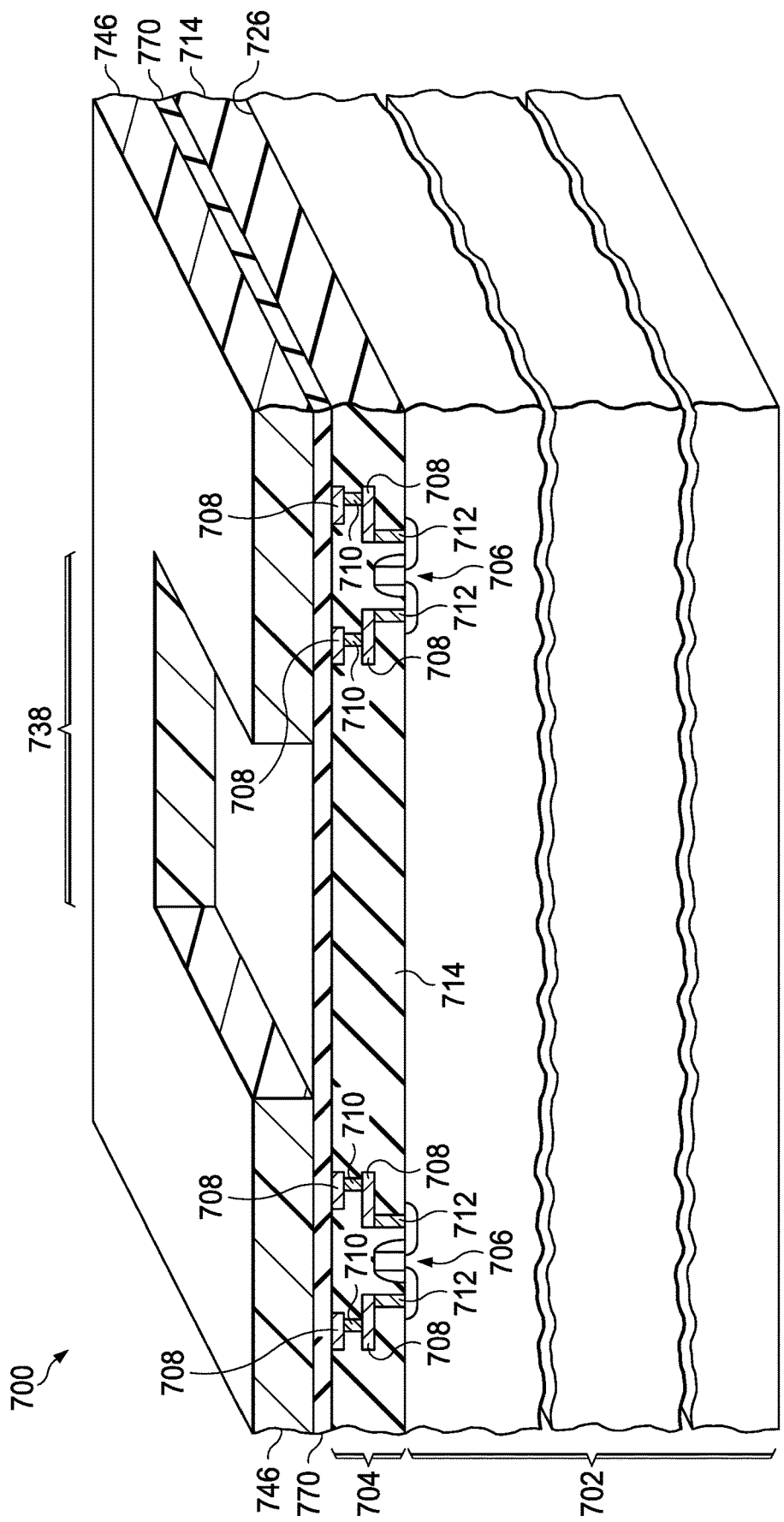

Referring to FIG. 7B, an optional ILD layer 770 may be formed over an existing top surface of the first portion 704 of the interconnect region. The optional ILD layer 770 includes a main layer of silicon dioxide-based dielectric material, and may include an etch stop layer under the main layer and may include a cap layer over the main layer.

An isolation mask 746 is formed over the first portion 704 of the interconnect region, and over the optional ILD layer 770 if present. The isolation mask 746 may be formed as described in reference to FIG. 2A. In the instant example, the isolation mask 746 may expose an area for an isolated region 738, which is in the interconnect region in the instant example, and covers an area surrounding the isolated region 738.

Figure 7C:
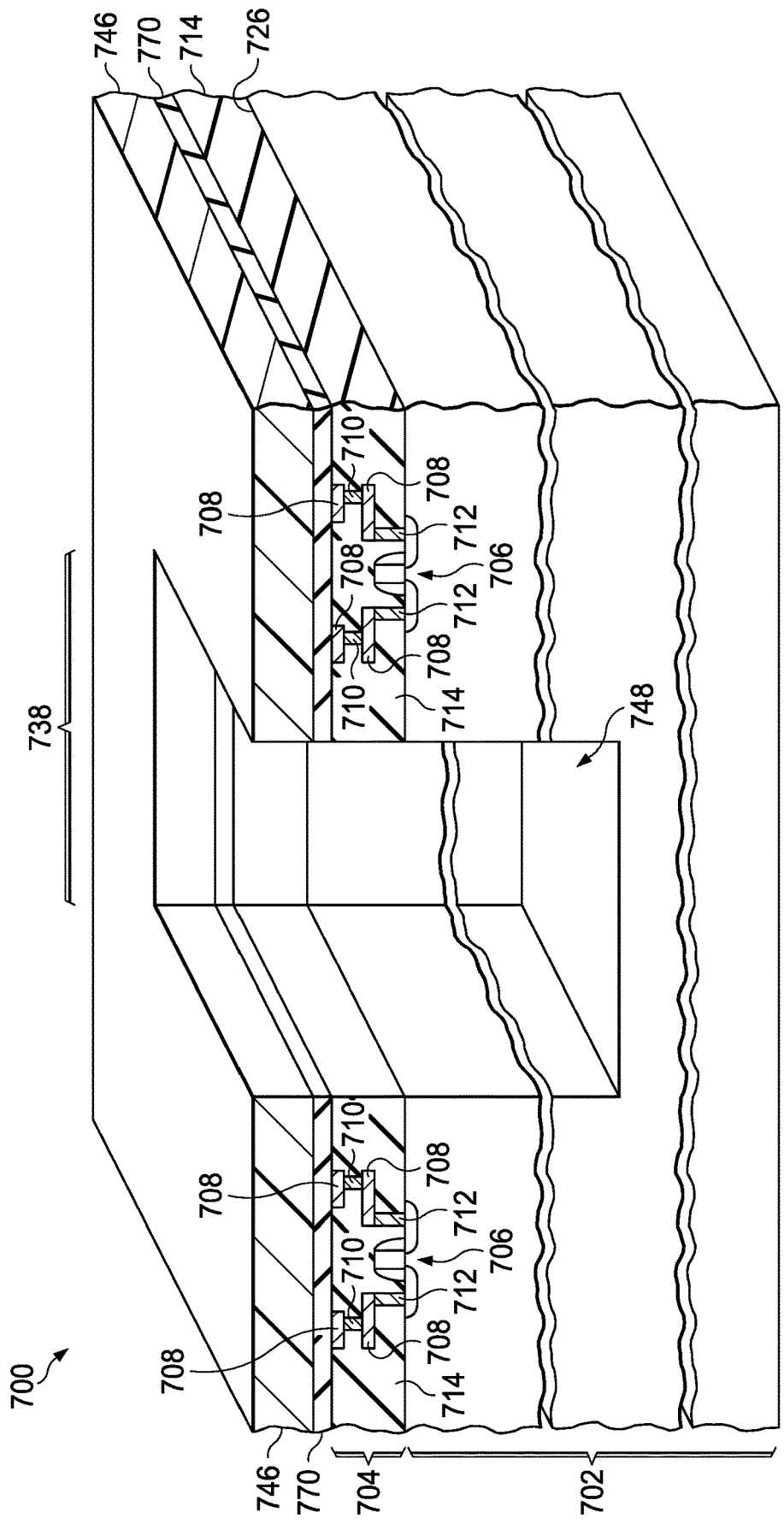

Referring to FIG. 7C, an isolation trench 748 is formed through the optional ILD layer 770, through the first portion 704 of the interconnect region and at least 40 microns deep into the substrate 702. At least 200 microns of substrate material remains in the substrate 702 under the isolation trench 748 when the isolation trench 748 is formed. The isolation trench 748 may be formed with RIE processes, as described in reference to FIG. 5D and FIG. 5E. Alternatively, the isolation trench 748 may be formed through the optional ILD layer 770 and through the first portion 704 of the interconnect region by a first wet etch process comprising a dilute buffered aqueous solution of hydrofluoric acid, and into the substrate 702 by a second wet etch process comprising a planar etch solution of hydrofluoric acid, nitric acid and acetic acid.

Figure 7D:
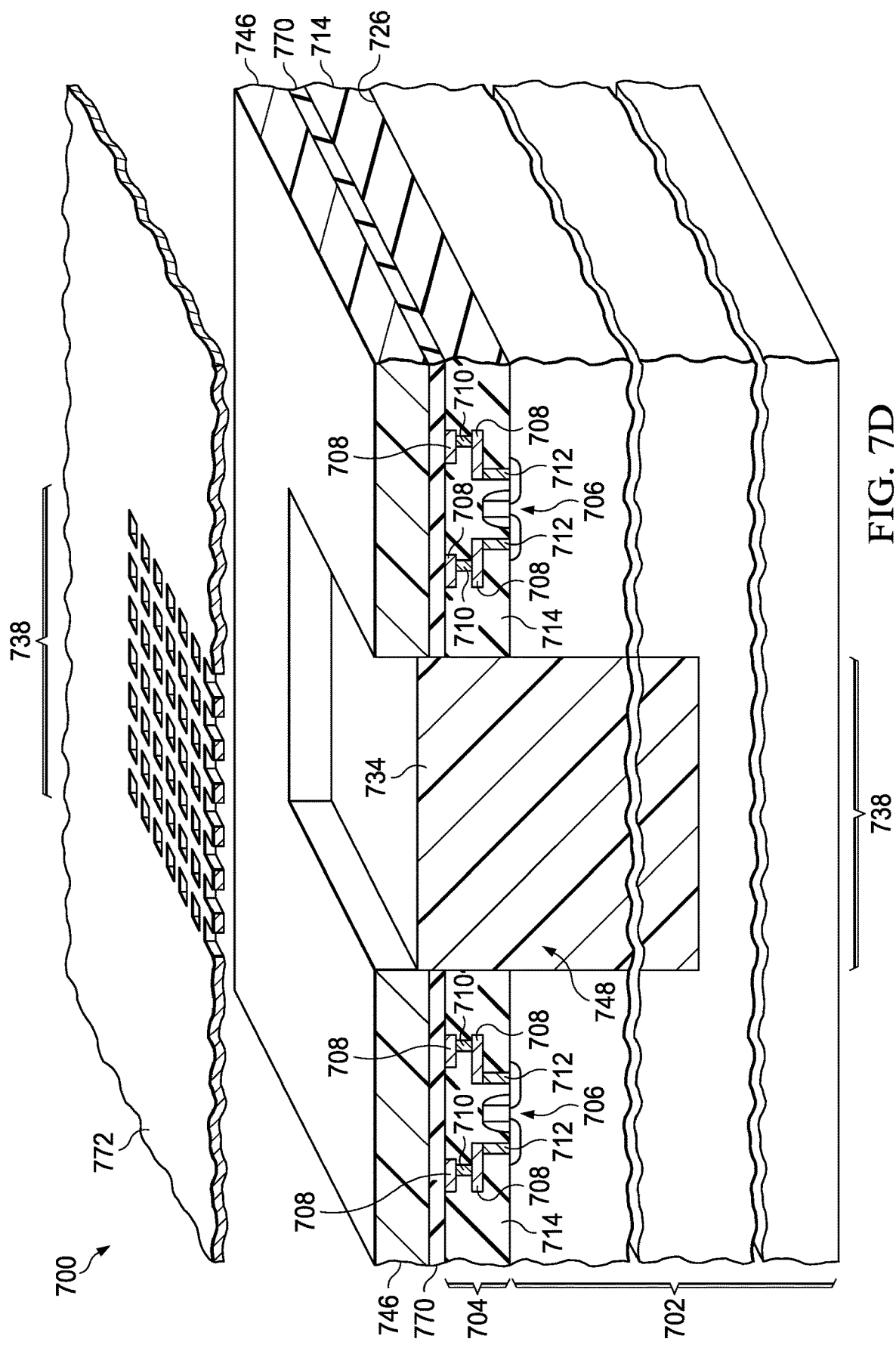

Referring to FIG. 7D, dielectric material 734 is formed in the isolation trench 748 proximate to the top surface of the first portion 704 of the interconnect region. The dielectric material 734 may be formed in the isolation trench 748, for example, by a force fill process using a patterned screen 772, referred to as a screen print process. Other methods of forming the dielectric material 734 in the isolation trench 748 are within the scope of the instant example. The dielectric material 734 may include an organic polymer material, a silicone polymer, a silicon dioxide-based material, a sol gel and/or a ceramic slurry. In the instant example, the isolation mask 746 may be left in place while the dielectric material 734 is formed in the isolation trench 748, which may advantageously protect the optional ILD layer 770 and the first portion 704 of the interconnect region. Excess dielectric material over the isolation mask 746, if present, is removed, leaving the dielectric material 734 in the isolation trench 748 to provide the isolation structure 724. The isolation mask 746 may be subsequently removed in the instant example before curing the dielectric material 734. The dielectric material 734 may optionally be formed in the isolation trench 748 in more than one partial fill step, possibly with cure operations between the partial fill steps.

Figure 7E:
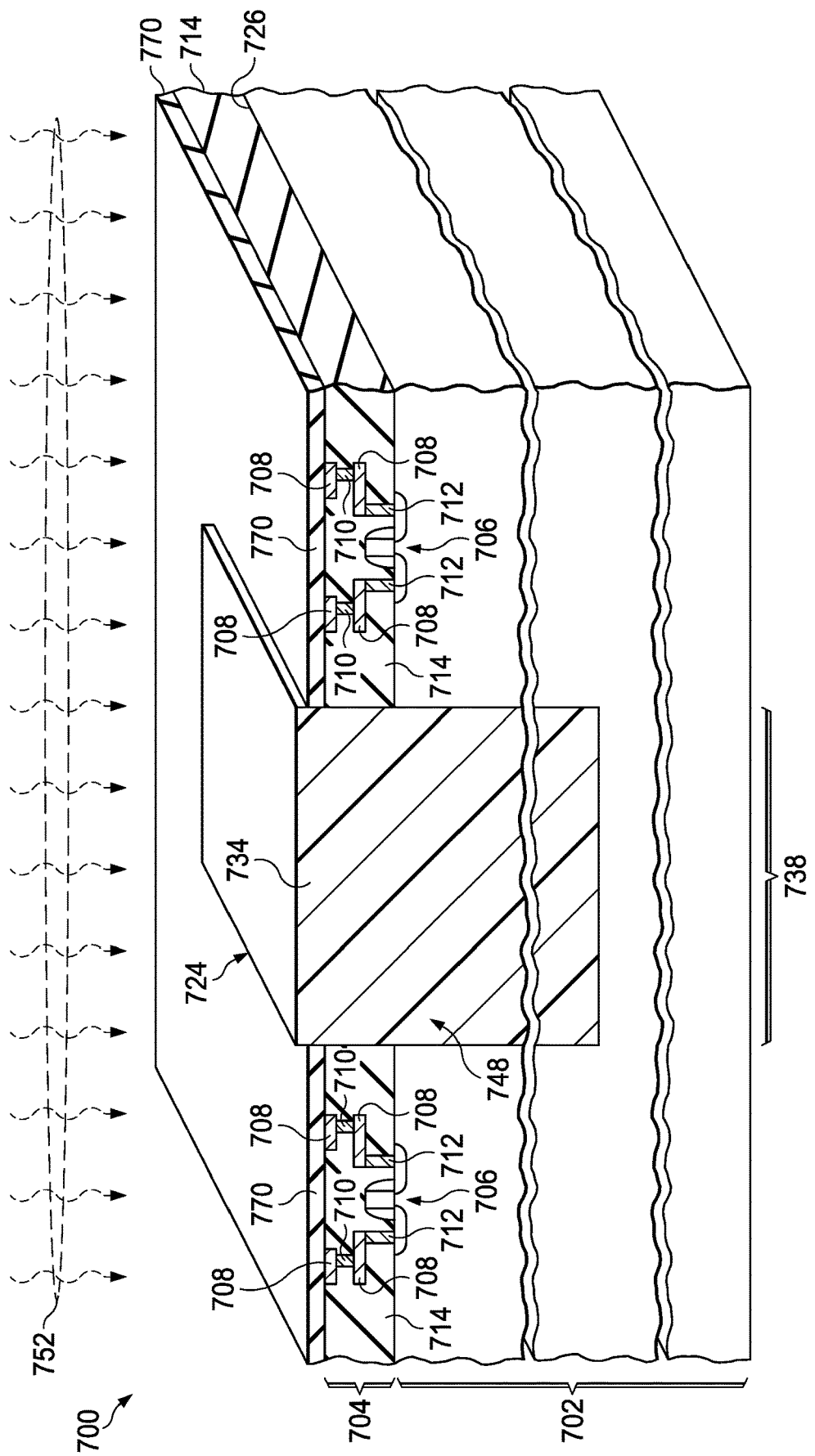

Referring to FIG. 7E, the dielectric material 734 in the isolation trench 748 may optionally be cured by a thermal process 752. The thermal process 752 heats the integrated circuit 700 to a temperature no greater than 320° C., which may advantageously reduce degradation of the components 706, the contacts 712, the interconnects 708 and the vias 710, compared to forming an isolation structure at a higher temperature.

Figure 7F:
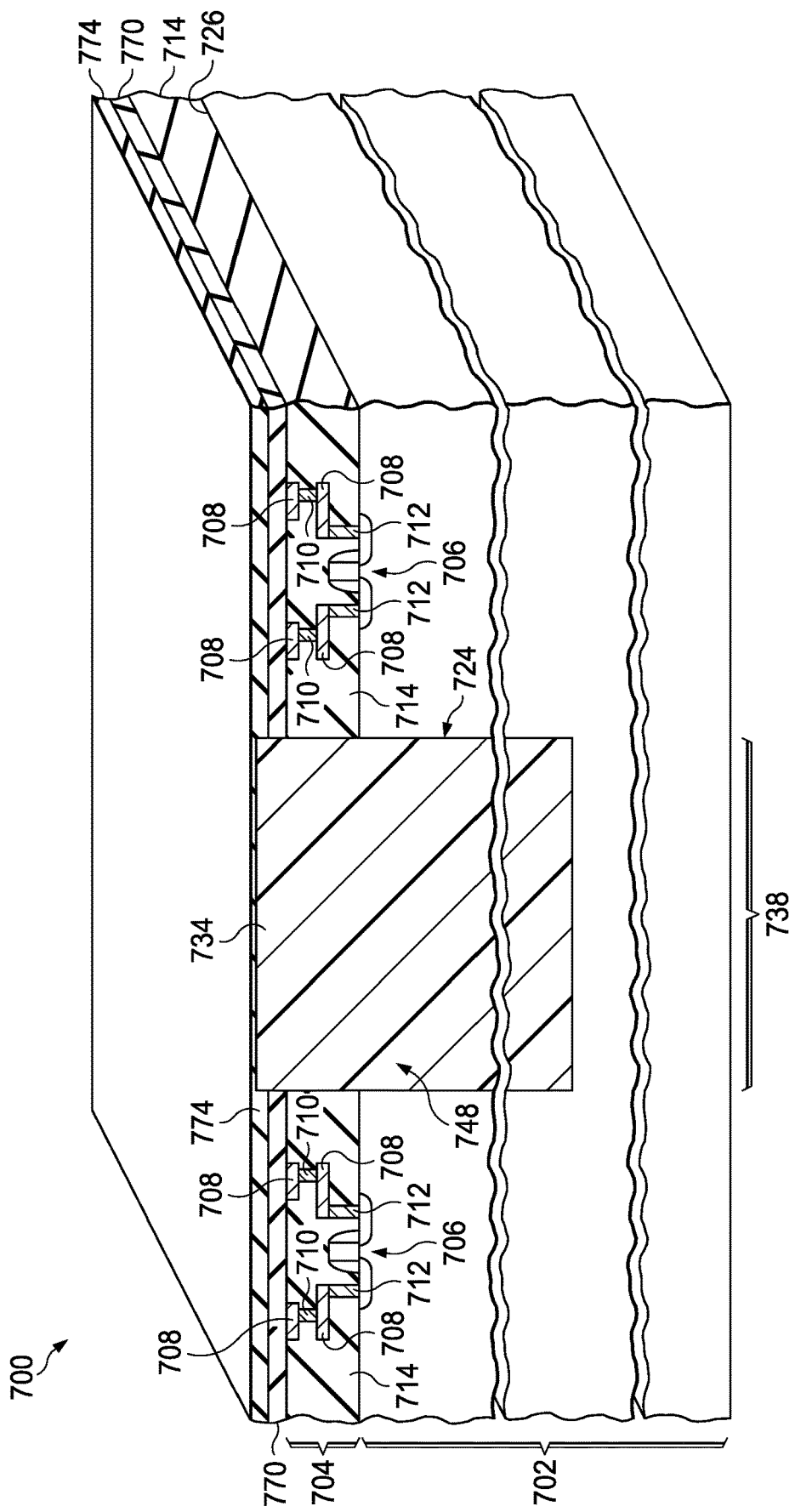

Referring to FIG. 7F, a planarizing dielectric layer 774 may optionally be formed over the isolation structure 724 and the optional ILD layer 770 and the first portion 704 of the interconnect region. The planarizing dielectric layer 774 may include silicon dioxide-based material formed from MSQ or HSQ applied by a spin cat process. The planarizing dielectric layer 774 may optionally be planarized, for example by a CMP process or an etchback process. The planarizing dielectric layer 774 provides a top surface that is more planar than the combined top surfaces of the dielectric material 734 and the optional ILD layer 770 and the first portion 704 of the interconnect region, which may advantageously increase process latitude for forming additional layers of interconnects on the integrated circuit 700.

Figure 7G:
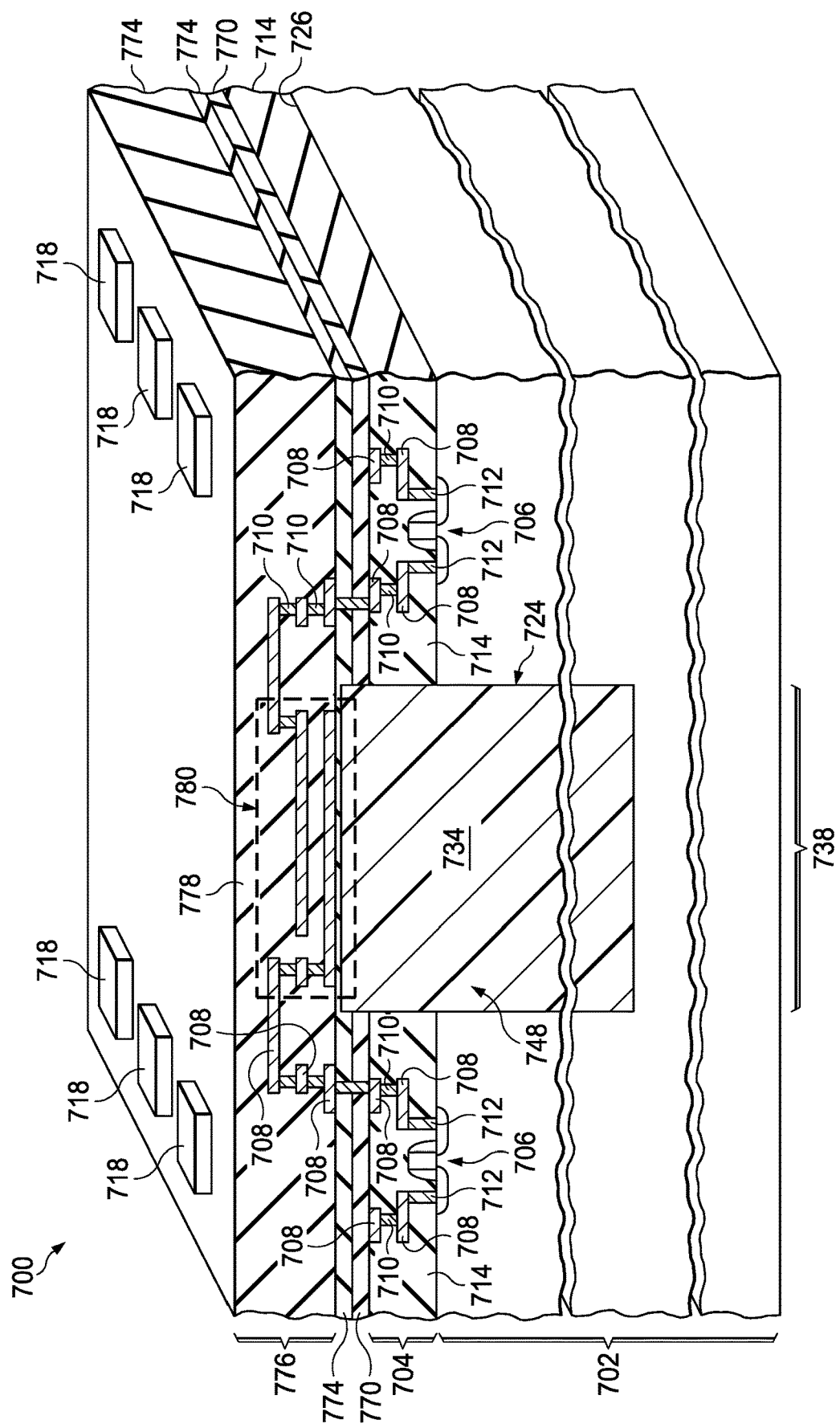

Referring to FIG. 7G, a second portion 776 of the interconnect region is formed over the first portion 704 of the interconnect region and the optional ILD layer 770, on the optional planarizing dielectric layer 774 if present. The second portion 776 of the interconnect region includes dielectric layers 778, and includes interconnects 708 and vias 710 formed in the dielectric layers 778. The dielectric layers 778 may include polyimide or other organic material, which may advantageously be formed at lower temperatures than silicon dioxide-based material. The interconnects 708 may be formed, for example, by etching aluminum layers to form aluminum interconnects, by a copper damascene process, or by electroplating copper on a seed layer. The interconnects 708 and vias 710 extend over the isolation structure 724, for example to provide connections between the components 706. Bond pads 718 are formed to provide external connections for the integrated circuit 700.

An isolated component 780 such as a capacitor as depicted in FIG. 7G, or an inductor or transformer, is formed in the isolated region 738 in the second portion 776 of the interconnect region over the isolation structure 724. The isolated component 780 is electrically coupled to one or more of the components 706 of the integrated circuit 700, and is isolated from the substrate 702 by the dielectric material 734, which may advantageously improve an efficiency of the isolated component 780. Elements of the isolated component 780 may be formed concurrently with the dielectric layers 778, the interconnects 708 and the vias 710 of the second portion 776 of the interconnect region, advantageously reducing a fabrication cost of the integrated circuit 700. Forming the isolated component 780 over the isolated structure 724 may provide a lower system cost for an application using the integrated circuit 700 compared to system having a separate packaged device for the isolated component.

Figure 8B:
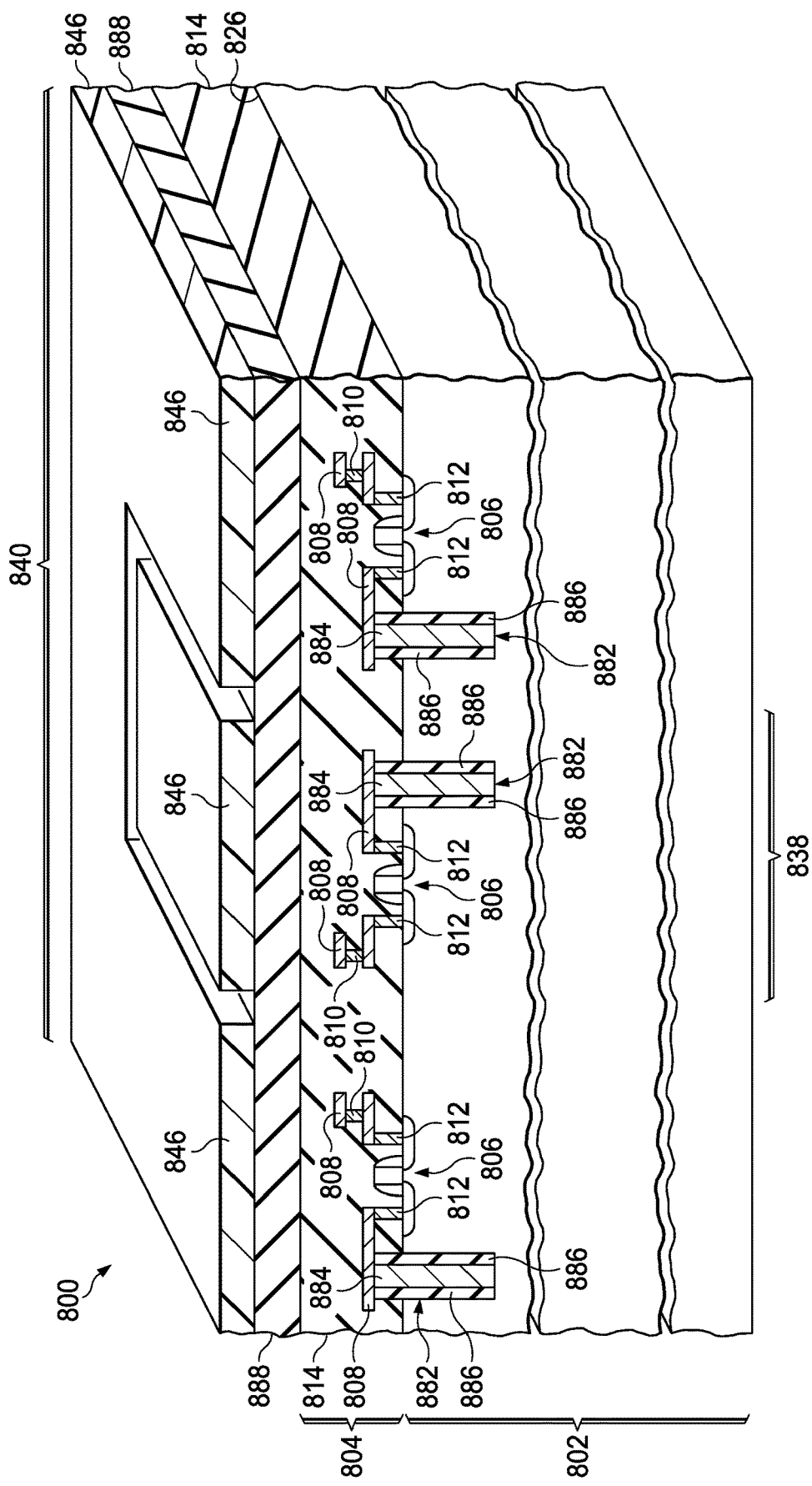

FIG. 8A through FIG. 8G are cross sections of another example integrated circuit with an isolation structure, depicted in successive stages of an example method of formation. Referring to FIG. 8A, the integrated circuit 800 includes a substrate 802 comprising a semiconductor material, for example a semiconductor wafer that is 525 microns to 925 microns thick at this stage of formation of the integrated circuit 800. Components 806 are formed at a top surface 826 of the substrate 802. A first portion 804 of an interconnect region is formed over the top surface 826 of the substrate 802 and over the components 806. The first portion 804 of the interconnect region includes a stack of dielectric layers 814, and contacts 812, interconnects 808 and vias 810 formed in the dielectric layers 814. In the instant example, upper portions 882 of through-substrate vias (TSVs) may be formed, extending from instances of the interconnects 808 into the substrate 802. Each of the upper portions 882 of the TSVs may include, for example, a center conductor 884 of tungsten which is electrically coupled to a corresponding interconnect 808, laterally surrounded by a dielectric liner 886 which laterally isolates the center conductor 884 from the substrate 802. Other configurations of the upper portions 882 of the TSVs are within the scope of the instant example.

Referring to FIG. 8B, a layer of hard mask material 888 is formed over the interconnect region 804. The layer of hard mask material 888 may include one or more layers of inorganic dielectric material such as silicon nitride, silicon carbide, silicon carbide nitride and/or aluminum oxide. An isolation mask 846 is formed over the layer of hard mask material 888 exposing an area for an isolation structure and covering an area for an isolated region 838, which is a first portion of the substrate 802 in the instant example, and an area for a second portion 840 of the substrate 802. The isolation mask 846 may include photoresist formed by a photolithographic process, and may possibly include an anti-reflection layer such as a BARC. The area for the isolation structure may have a closed-loop configuration as depicted in FIG. 8B, or may have another configuration.

Figure 8C:
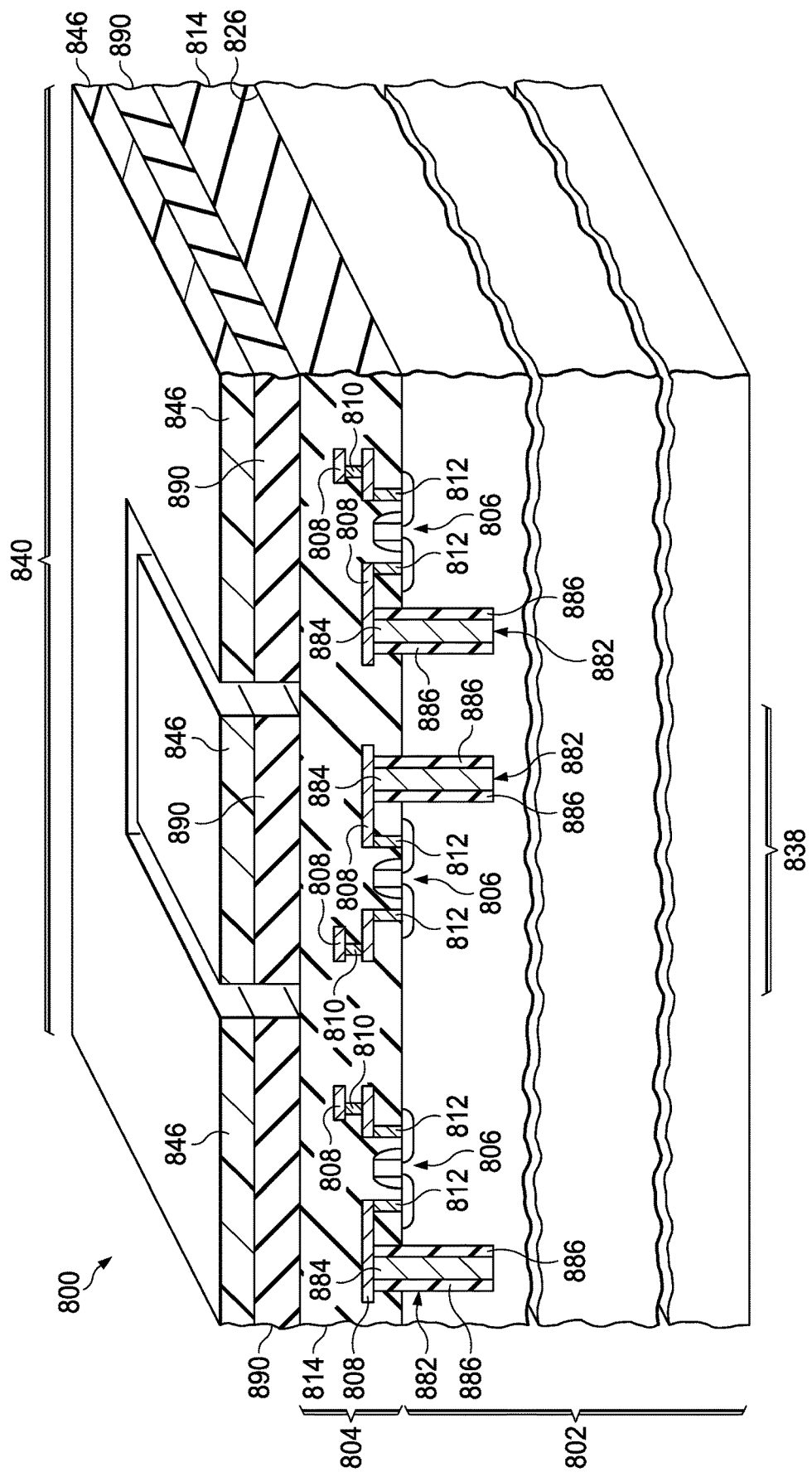

Referring to FIG. 8C, hard mask material is removed from the layer of hard mask material 888 of FIG. 8B in the area exposed by the isolation mask 846 to form an isolation mask 890. The isolation mask 846 may be left in place during subsequent steps to form an isolation trench, or may optionally be removed before forming the isolation trench. The isolation mask 846 may be removed, for example, by an ash process followed by a wet clean process using an aqueous mixture of sulfuric acid and hydrogen peroxide and/or an aqueous mixture of ammonium hydroxide and hydrogen peroxide.

Figure 8D:
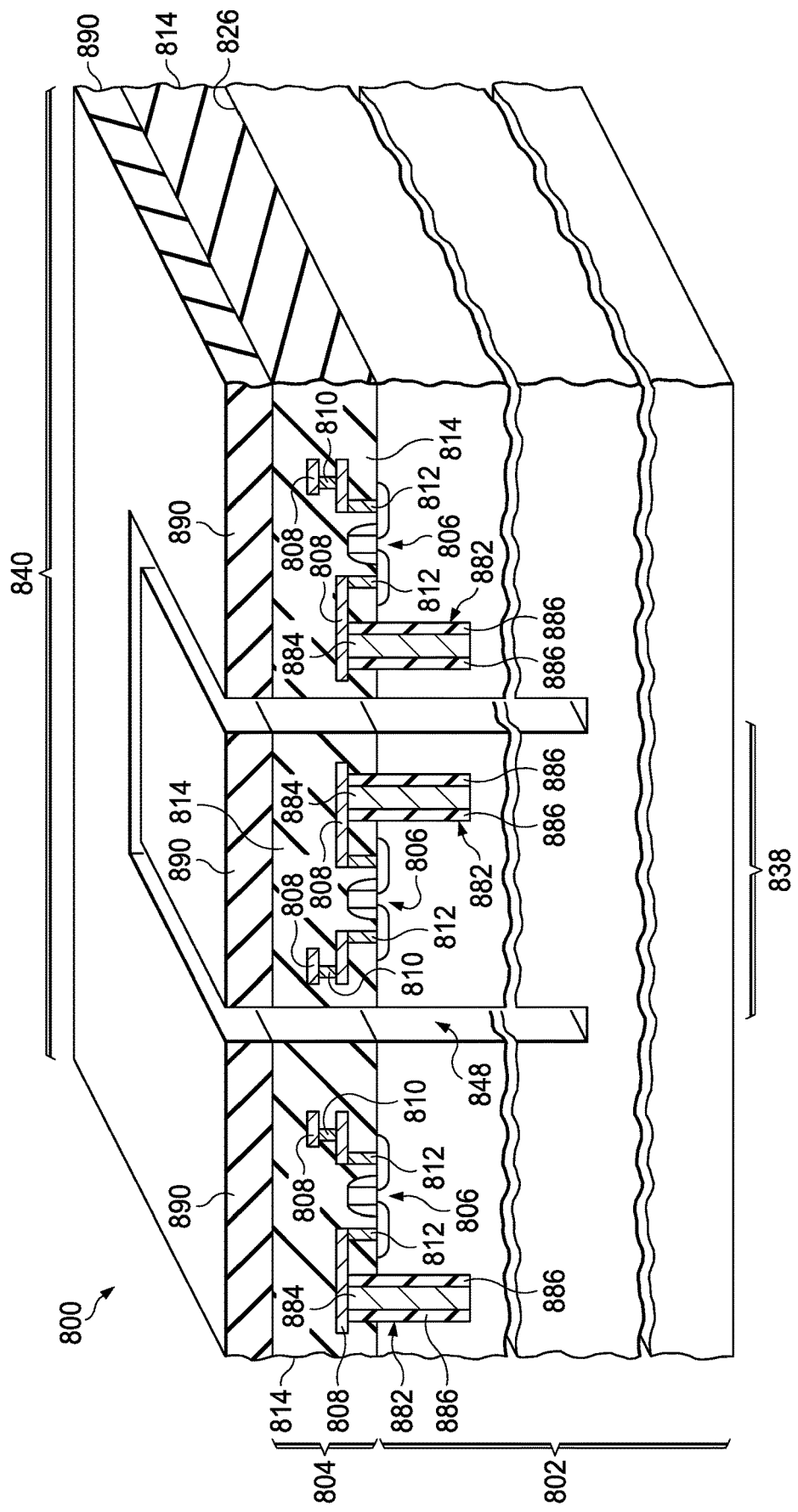

Referring to FIG. 8D, in the instant example, an isolation trench 848 is formed through the complete interconnect region 804, extending at least 40 microns deep into the substrate 802, in the area exposed by the hard mask 890. At least 200 microns of substrate material remains in the substrate 802 under the isolation trench 848 when the isolation trench 848 is formed. The isolation trench 848 may be formed through the interconnect region 804 by a first RIE process and through the substrate 802 by a second RIE process. The isolation mask 846 of FIG. 8C, if present when formation of the isolation trench 848 is begun, may be completely eroded before the isolation trench 848 is completely formed. A portion of the hard mask 890 may also be eroded during formation of the isolation trench 848. In the instant example, the hard mask 890 may be left in place after the isolation trench 848 is formed.

Figure 8E:
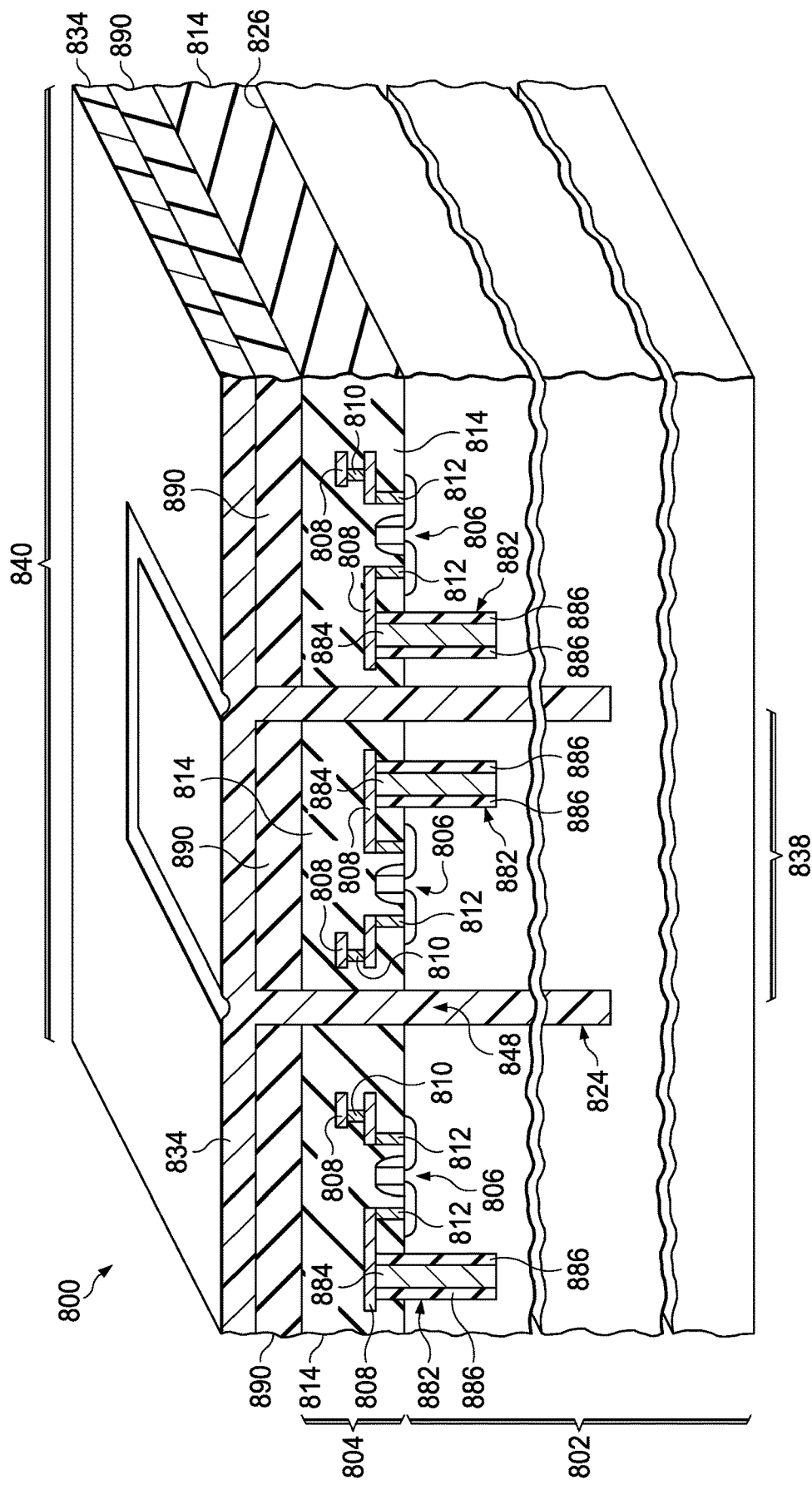

Referring to FIG. 8E, the isolation trench 848 is filled with dielectric material 834 to form the isolation structure 824. In the instant example, the dielectric material 834 may be provided to the isolation trench 848 by a vapor transfer process, in which the dielectric material covers the hard mask 890. The dielectric material 834 may include, for example, a parylene material such as Parylene C. Alternatively, the dielectric material 834 may be provided to the isolation trench 848 by a spin-coat process, in which the dielectric material also covers the hard mask 890. The dielectric material 834 may include, for example, HSQ or MSQ.

Figure 8F:
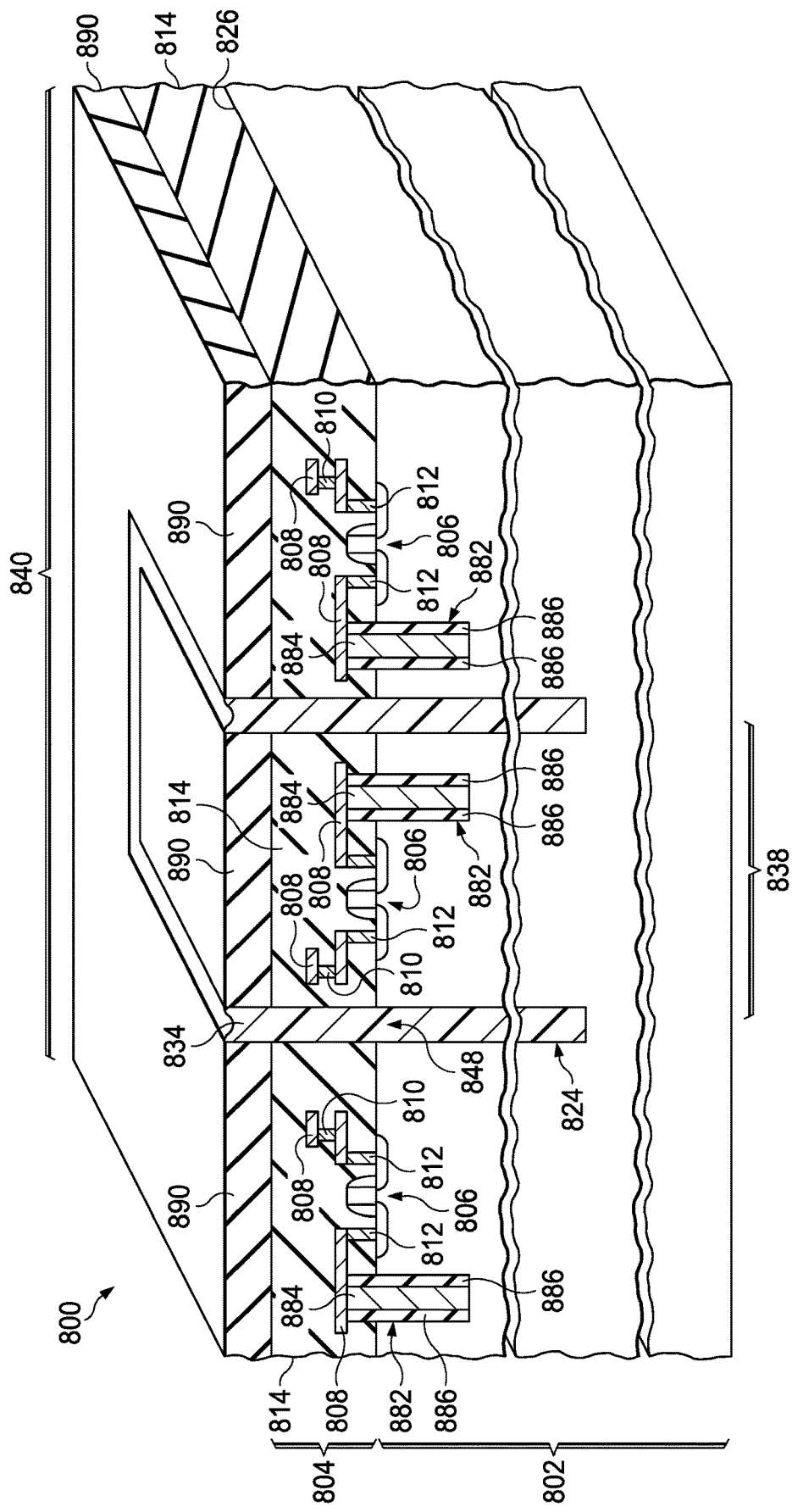

Referring to FIG. 8F, the dielectric material 834 may optionally be removed from over the hard mask 890, leaving the dielectric material 834 in the isolation trench 848. Organic material in the dielectric material 834 may be removed, for example, by an ash process. Silicon dioxide-based material in the dielectric material 834 may be removed, for example, by a dilute buffered aqueous solution of hydrofluoric acid. Alternatively, the dielectric material 834 may optionally be left in place over the hard mask 890.

Figure 8G:
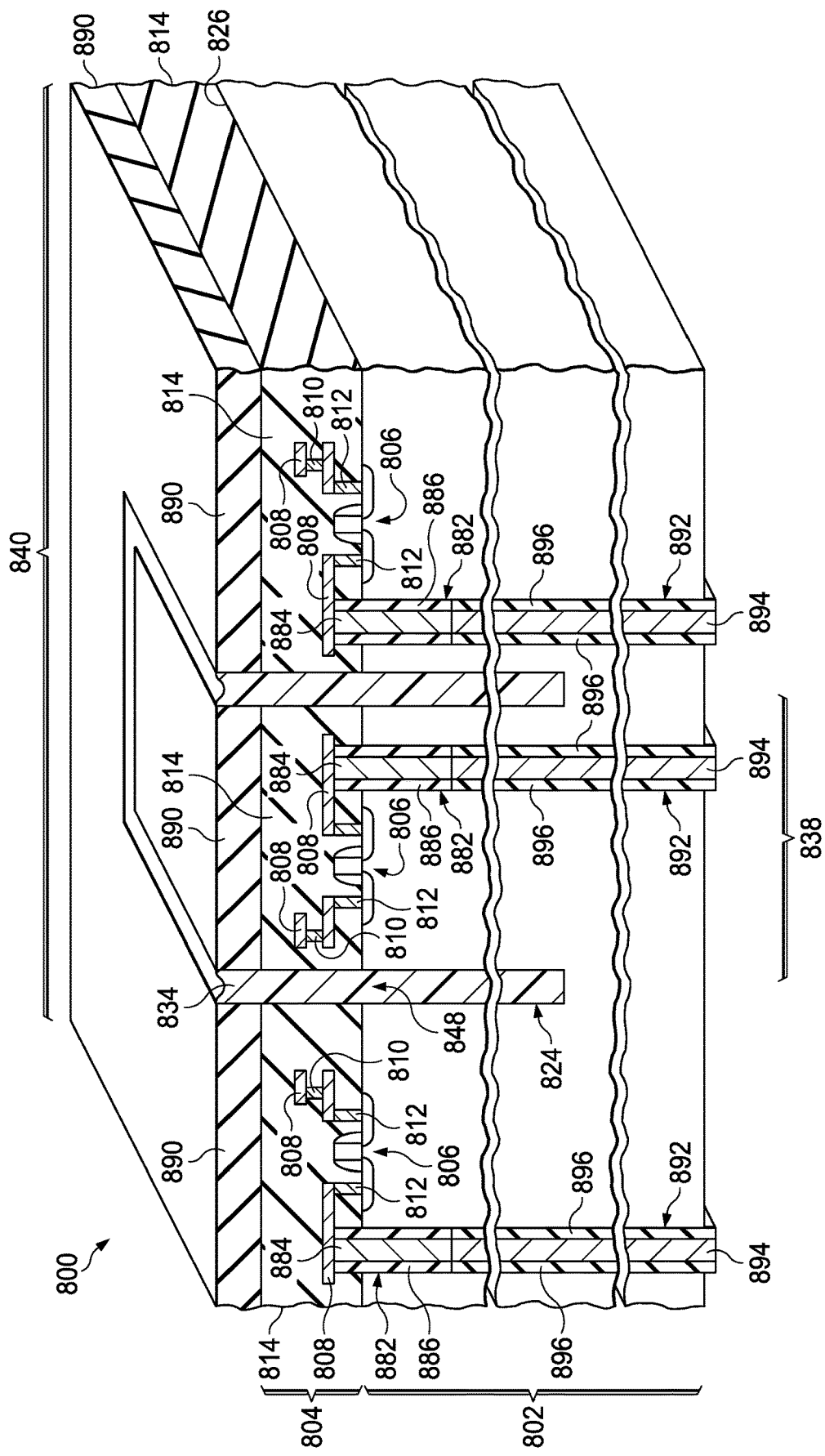

Referring to FIG. 8G, lower portions 892 of the TSVs may be formed in the substrate 802 to make electrical connections to the upper portions 882 of the TSVs. Each of the lower portions 892 of the TSVs may include, for example, a center conductor 894 of metal isolated from the substrate 802 by a surrounding dielectric liner 896. The center conductor 894 is electrically coupled to a corresponding center conductor 884 of an instance of the upper portions 884 of the TSVs. Other configurations of the lower portions 892 of the TSVs are within the scope of the instant example. The substrate 802 may optionally be thinned from its bottom surface before forming the lower portions 892 of the TSVs, which may enable a tighter pitch for the lower portions 892. Forming the isolation structure 824 as described in the instant example may advantageously provide a desired mechanical strength for the substrate 802 during the thinning process.

In an alternative version of the instant example, the complete TSVs could be formed in one operation sequence from the top surface 826 of the substrate 802, before the isolation structure 824 is formed. In a further version, vias for the TSVs could be formed concurrently with the isolation trench 848 and subsequently filled with the dielectric liners 896 and center conductors 894.

Modifications are possible in the described embodiments, and other embodiments are possible, within the scope of the claims.

What is claimed is:

1. A method of forming an integrated circuit, the method comprising:
    forming components at a top surface of a substrate comprising semiconductor material;
    forming an interconnect region over the substrate, comprising forming dielectric layers and forming interconnects in the dielectric layers; forming an isolation trench through at least a portion of the interconnect region and into the substrate at least 40 microns deep, so that at least 200 microns of substrate material remains in the substrate under the isolation trench, the at least a portion of the interconnect region containing at least a portion of the interconnects; and
    forming dielectric material in the isolation trench to form an isolation structure, the dielectric material filling the isolation trench and contacting the substrate and the interconnect region, the dielectric material of the isolation structure separating an isolated region in the interconnect region of the integrated circuit from at least a portion of the substrate, the isolated region containing an isolated component of the integrated circuit above the isolation structure, the isolated component being electrically coupled to at least one of the components at the top surface of the substrate through the portion of the interconnects of the portion of the interconnect region;
    wherein forming the dielectric material in the isolation trench comprises:
    providing a first dielectric material into a lower portion of the isolation trench; and
    providing a second dielectric material into an upper portion of the isolation trench above the first material.

2. A method of forming an integrated circuit, the method comprising:
    forming components at a top surface of a substrate comprising semiconductor material;
    forming an interconnect region over the substrate, comprising forming dielectric layers and forming interconnects in the dielectric layers; forming an isolation trench through at least a portion of the interconnect region and into the substrate at least 40 microns deep, so that at least 200 microns of substrate material remains in the substrate under the isolation trench, the at least a portion of the interconnect region containing at least a portion of the interconnects;
    forming dielectric material in the isolation trench to form an isolation structure, the dielectric material filling the isolation trench and contacting the substrate and the interconnect region, the dielectric material of the isolation structure separating an isolated region in the interconnect region of the integrated circuit from at least a portion of the substrate, the isolated region containing an isolated component of the integrated circuit above the isolation structure, the isolated component being electrically coupled to at least one of the components at the top surface of the substrate through the portion of the interconnects of the portion of the interconnect region;
    removing material from a bottom surface of the substrate to expose a bottom of the isolation; and
    wherein forming the dielectric material in the isolation trench comprises:
    providing a first dielectric material into a lower portion of the isolation trench; and
    providing a second dielectric material into an upper portion of the isolation trench above the first material.

3. A method of forming an integrated circuit, the method comprising:
    forming components at a top surface of a substrate comprising semiconductor material;
    forming an interconnect region over the substrate, comprising forming dielectric layers and forming interconnects in the dielectric layers;
    forming an isolation mask over the interconnect region, the isolation mask exposing an area for an isolation trench;
    removing material from the interconnect region and the substrate in the area exposed by the isolation mask to form an isolation trench completely through the interconnect region and into the substrate at least 40 microns deep, so that at least 200 microns of substrate material remains in the substrate under the isolation trench;
    forming dielectric material in the isolation trench by an inkjet process at a substrate temperature no greater than 320° C. to form an isolation structure, the dielectric material contacting the substrate and the interconnect region, the isolation structure separating an isolated region of the integrated circuit from at least a portion of the substrate, the isolated region containing an isolated component of the integrated circuit above the isolation structure; and
    curing the dielectric material in the isolation trench at a substrate temperature no greater than 320° C.; and
    wherein forming the dielectric material in the isolation trench comprises:
    providing a first dielectric material into a lower portion of the isolation trench; and providing a second dielectric material into an upper portion of the isolation trench above the first material.

\* \* \* \* \*